United States Patent
Lee et al.

(10) Patent No.: US 11,923,035 B2
(45) Date of Patent: Mar. 5, 2024

(54) PSEUDO DUAL PORT MEMORY DEVICES

(71) Applicant: Samsung Electronics Co., Ltd., Suwon-si (KR)

(72) Inventors: Chan Ho Lee, Hwaseong-si (KR); Tae Min Choi, Seoul (KR); Jeong Kyun Kim, Hwaseong-si (KR); Hyeong Cheol Kim, Suwon-si (KR); Suk Youn, Seoul (KR); Ju Chang Lee, Suwon-si (KR); Kyu Won Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/668,760

(22) Filed: Feb. 10, 2022

(65) Prior Publication Data

US 2022/0366944 A1    Nov. 17, 2022

(30) Foreign Application Priority Data

May 12, 2021 (KR) .......................... 10-2021-0061423
May 13, 2021 (KR) .......................... 10-2021-0061801
Aug. 9, 2021 (KR) .......................... 10-2021-0104638

(51) Int. Cl.
*G11C 7/06* (2006.01)
*G11C 7/10* (2006.01)
*G11C 7/12* (2006.01)

(52) U.S. Cl.
CPC .............. *G11C 7/06* (2013.01); *G11C 7/1012* (2013.01); *G11C 7/1048* (2013.01); *G11C 7/1063* (2013.01); *G11C 7/1069* (2013.01); *G11C 7/1096* (2013.01); *G11C 7/12* (2013.01)

(58) Field of Classification Search
CPC ........ G11C 7/06; G11C 7/1012; G11C 7/1048; G11C 7/1063; G11C 7/1069; G11C 7/1096; G11C 7/12
See application file for complete search history.

(56) References Cited

U.S. PATENT DOCUMENTS

| 6,078,544 A | 6/2000 | Park | |
| 6,160,746 A * | 12/2000 | Park | ......................... G11C 7/12 |
| | | | 365/204 |
| 6,452,851 B1 * | 9/2002 | Endo | ....................... G11C 5/025 |
| | | | 365/207 |

(Continued)

FOREIGN PATENT DOCUMENTS

KR    20180019571 A    2/2018

*Primary Examiner* — Vanthu T Nguyen
(74) *Attorney, Agent, or Firm* — Myers Bigel, P.A.

(57) ABSTRACT

A pseudo dual port memory device in which an operating speed is improved and stability is increased is provided. The pseudo dual port memory device may include a memory cell, a pair of bit lines connected to the memory cell, a write driver, a sense amp, and a column multiplexer which is connected to the bit lines, receives a write multiplexer control signal and a read multiplexer control signal, connects the bit lines to the write driver in response to the write multiplexer control signal, and connects the bit lines to the sense amp in response to the read multiplexer control signal. A precharge control signal generation circuit which is connected to the column multiplexer may generate a precharge control signal on the basis of the read and write multiplexer control signals, and a bit line precharge circuit may precharge the bit lines based on the precharge control signal.

18 Claims, 22 Drawing Sheets

(56) References Cited

U.S. PATENT DOCUMENTS

| | | | |
|---|---|---|---|
| 6,996,661 B2* | 2/2006 | Hasegawa | G06F 13/1689 |
| | | | 711/149 |
| 8,619,477 B2 | 12/2013 | Wang et al. | |
| 8,958,254 B2 | 2/2015 | Joshi et al. | |
| 9,135,971 B2 | 9/2015 | Chen et al. | |
| 9,384,825 B2 | 7/2016 | Lin et al. | |
| 9,437,285 B1 | 9/2016 | Barowski et al. | |
| 9,496,029 B1 | 11/2016 | Moharir | |
| 10,916,275 B1* | 2/2021 | Ghosh | G11C 11/419 |
| 11,227,651 B2* | 1/2022 | Banerjee | G11C 7/1087 |
| 2014/0185366 A1 | 7/2014 | Chandwani et al. | |
| 2021/0043245 A1 | 2/2021 | Ji et al. | |

* cited by examiner

FIG. 4

| Data | SN1 | SN2 |
|------|-----|-----|
| 0    | L   | H   |
| 1    | H   | L   |

PSEUDO DUAL PORT MEMORY DEVICES

CROSS-REFERENCE TO RELATED APPLICATIONS

This application claims the benefit of Korean Patent Application No. 10-2021-0061423, filed on May 12, 2021, of Korean Patent Application No. 10-2021-0061801, filed on May 13, 2021, and of Korean Patent Application No. 10-2021-0104638, filed on Aug. 9, 2021, in the Korean Intellectual Property Office, and the entire contents of each above-identified application are incorporated by reference herein.

BACKGROUND

1. Technical Field

The present disclosure relates to pseudo dual port memory devices.

2. Description of the Related Art

Semiconductor devices such as application processors may be comprised of a system-on-chip (hereinafter, SoC) including a plurality of functional blocks (IP), and the system-on-chip (SOC) may include a SRAM (Static Random Access Memory) that is generally used for applications of a cache or a buffer memory.

A dual port SRAM cell may include at least eight transistors. However, conventional single port SRAM cells include six transistors. That is, the dual port SRAM cell requires two more access transistors than the single port SRAM cell. Because the single port SRAM is denser than the dual port SRAM, a pseudo dual port (PDP) SRAM that occupies a smaller area has been developed. The pseudo dual port SRAM performs both read and write operations on a single clock signal. As a result, it may have a slower operating speed than the existing SRAM. Therefore, a solution to an increase in operating speed of the pseudo dual port SRAM is desired.

SUMMARY

Aspects of the present inventive concepts provide a pseudo dual port memory device in which an operating speed may be improved and in which stability may be increased.

Aspects of the present invention also provide a pseudo dual port memory device in which signal integrity is improved and a cycle time is reduced.

However, aspects of the present disclosure are not restricted to the those set forth above and explicitly recited herein. The above and other aspects of the present disclosure will become more apparent to those of ordinary skill in the art to which the present disclosure pertains by referencing the detailed description of the present invention given below.

According to an aspect of the present disclosure, there is provided a pseudo dual port memory device that may include a memory cell, a pair of bit lines connected to the memory cell, a write driver, a sense amp, and a column multiplexer which is connected to the bit lines, is configured to receive a write multiplexer control signal and a read multiplexer control signal, and is configured to connect the bit lines to the write driver in response to the write multiplexer control signal and connect the bit lines to the sense amp in response to the read multiplexer control signal. The memory device may include a precharge control signal generation circuit which is connected to the column multiplexer and is configured to generate a precharge control signal on the basis of the write multiplexer control signal and the read multiplexer control signal, and a bit line precharge circuit which is connected to the precharge control signal generation circuit and the pair of bit lines and is configured to precharge the bit lines on the basis of the precharge control signal.

According to another aspect of the present disclosure, there is provided a pseudo dual port memory device comprising a first column line, a second column line which is different from the first column line, a write driver connected to both of the first and second column lines, and a sense amp connected to both of the first and second column lines. The first column line includes a first memory cell, a pair of first bit lines connected to the first memory cell, a first column multiplexer which is connected to the first bit lines and is configured to connect the first bit lines to the write driver in response to a first write multiplexer control signal and connect the first bit lines to the sense amp in response to a first read multiplexer control signal, and a first bit line precharge circuit configured to precharge the first bit lines in response to at least one of the first write multiplexer control signal and the first read multiplexer control signal. The second column line includes a second memory cell, a pair of second bit lines connected to the second memory cell, a second column multiplexer which is connected to the second bit lines and is configured to connect the second bit lines to the write driver in response to a second write multiplexer control signal, and connect the second bit lines to the sense amp in response to a second read multiplexer control signal, and a second bit line precharge circuit configured to precharge the second bit lines in response to at least one of the second write multiplexer control signal and the second read multiplexer control signal.

According to another aspect of the present disclosure, there is provided a pseudo dual port memory device comprising a memory cell, a pair of bit lines connected to the memory cell, a column multiplexer connected to the bit lines and configured to receive a write multiplexer control signal and a read multiplexer control signal, a bit line precharge circuit configured to precharge the bit lines during a first time interval in response to at least one of the write multiplexer control signal and the read multiplexer control signal, a sense amp configured to perform a read operation during a second time interval subsequent to the first time interval, and a write driver configured to perform a write operation during a third time interval subsequent to the second time interval. The column multiplexer may be configured to connect the bit lines to the write driver in response to the write multiplexer control signal and connect the bit lines to the sense amp in response to the read multiplexer control signal, and the bit line precharge circuit is configured to not perform precharge on the bit lines during a fourth time interval between the second time interval and the third time interval.

According to another aspect of the present disclosure, there is provided a pseudo dual port memory device comprising a memory cell array which includes a plurality of word lines and memory cells connected to the plurality of word lines, an address buffer configured to receive and buffer a read address signal and a write address signal, a first word line decoder configured to decode the buffered read address signal and output a read word line enable signal, a second word line decoder configured to decode the buffered write address signal and output a write word line enable signal, a first word line driver configured to select one of the plurality of word lines and apply a first word line voltage based on the read word line enable signal, and a second word line driver configured to select one of the plurality of word lines and apply a second word line voltage based on the write word line enable signal. The first and second word line voltages are both applied during a single clock cycle.

BRIEF DESCRIPTION OF THE DRAWINGS

These and/or other aspects will become apparent and more readily appreciated from the following description of the embodiments, taken in conjunction with the accompanying drawings in which:

FIG. 4 is a diagram for explaining the operation of the memory cell of FIG. 3.

DETAILED DESCRIPTION OF THE EMBODIMENTS

Hereinafter, some examples of embodiments according to the inventive concepts of the present disclosure will be described referring to the accompanying drawings.

Figure 1:
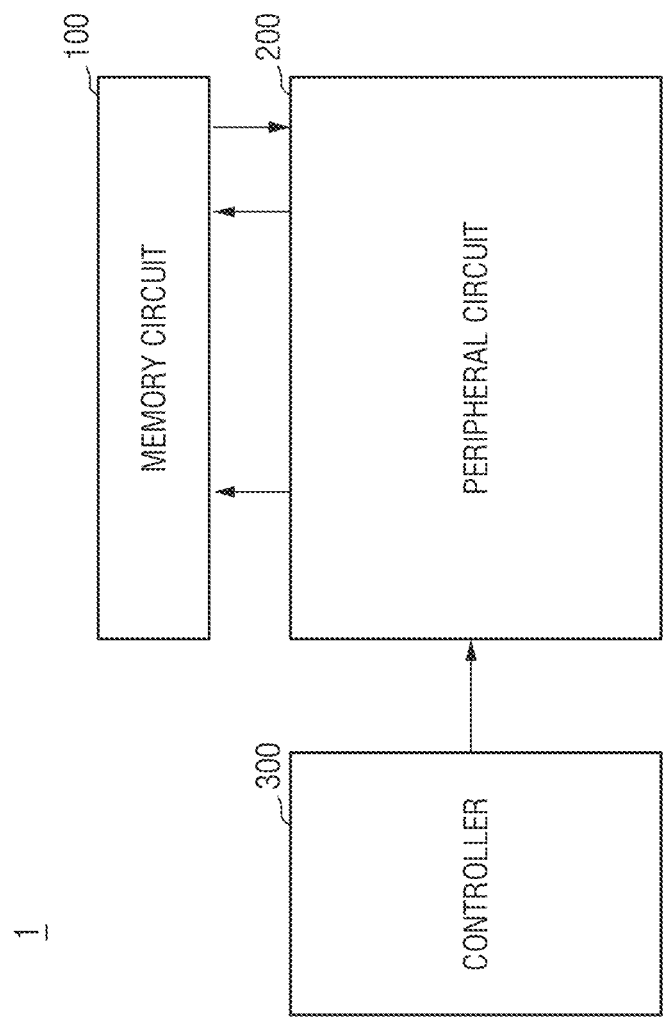
FIG. 1 is a block diagram of a memory device according to some embodiments.

FIG. 1 is a block diagram of a memory device according to some embodiments.

Referring to FIG. 1, a memory device 1 may include a memory circuit 100, a peripheral circuit 200, and a controller 300. Here, the memory device 1 may correspond to a pseudo dual port memory device. That is, the memory device 1 does not simultaneously perform data read and write operations during one clock cycle, but may sequentially perform the read and write operations during one clock cycle. That is, the read operation of data stored in the memory cell may be performed by being triggered at a rising edge of one clock cycle, and the write operation of data on the memory cell may be performed by being triggered at a falling edge of one clock cycle. However, the present disclosure is not limited thereto, and for example in some embodiments the write operation of data on the memory cell may be performed by being triggered at the rising edge of one clock cycle.

The memory circuit 100, the peripheral circuit 200, and the controller 300 may be connected to each other. The peripheral circuit 200 may be connected to both the memory circuit 100 and the controller 300, and may mediate signal transmission between the two devices. The controller 300 may transmit a control signal to the peripheral circuit 200 and the memory circuit 100 (via the peripheral circuit 200) that is configured to control the peripheral circuit 200 and the memory circuit 100, and may receive a response signal from the peripheral circuit 200. Here, the memory circuit 100 may correspond to a volatile memory device. That is, the memory device 1 may correspond to a SRAM.

Figure 2:
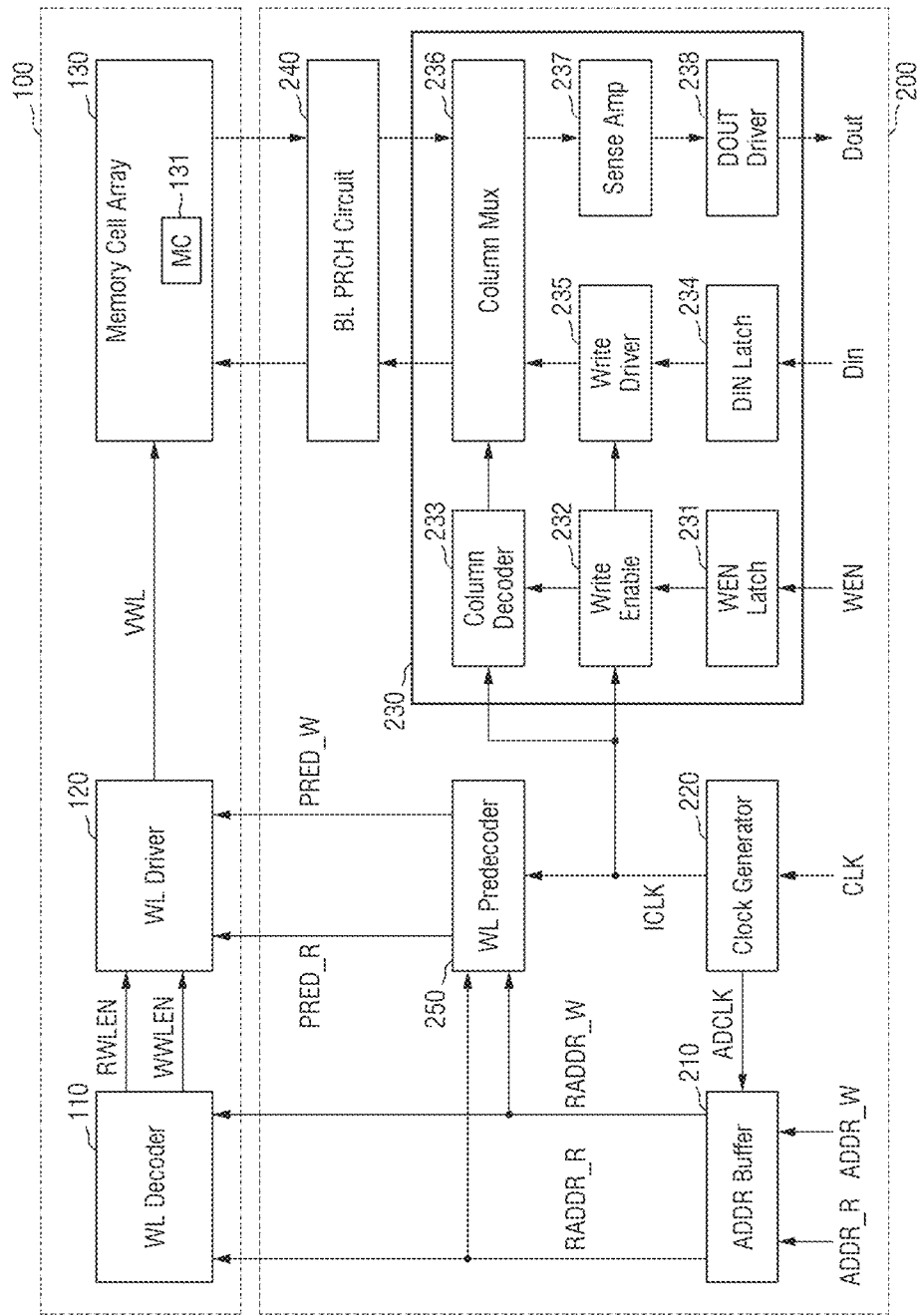
FIG. 2 is a block diagram for explaining the memory circuit and the peripheral circuits of FIG. 1.

FIG. 2 is a block diagram for explaining the memory circuit and the peripheral circuits of FIG. 1.

Referring to FIG. 2, the memory circuit 100 may include a word line decoder 110, a word line driver 120, and a memory cell array 130. The word line decoder 110 may receive from the peripheral circuit 200 a read row address signal RADDR_R and a write row address signal RADDR_W. The word line decoder 110 may decode each of the read row address signal RADDR_R and the write row address signal RADDR_W to output a read word line enable signal RWLEN and a write word line enable signal WWLEN. Through the decoding operation, the word line decoder 110 may select a word line to which the word line signal VWL is to be applied.

The word line driver 120 may select any one word line among a plurality of word lines of the memory cell array 130 according to the control of the word line decoder 110. For example, the word line driver 120 may receive the read word line enable signal RWLEN and/or the write word line enable signal WWLEN from the word line decoder 110, and may receive a read predeck signal PRED_R and/or a write predeck signal PRED_W from a word line predecoder 250 of the peripheral circuit 200. The word line driver 120 may select a word line to which the word line signal VWL of the read operation is applied on the basis of the read word line enable signal RWLEN and the read predeck signal PRED_R, and may apply the word line signal VWL of the write operation on the basis of the write word line enable signal WWLEN and the write predeck signal PRED_W. Here, the word line signal VWL may correspond to the word line drive voltage. The word line drive voltage may include a read word line voltage, a write word line voltage, or the like. Therefore, one of the plurality of word lines is selected, and the word line signal VWL may be applied.

The memory cell array 130 may be connected to the word line driver 120 through a plurality of word lines and may be connected through a plurality of bit lines to a bit line precharge circuit 240 and a column multiplexer 236 of the peripheral circuit 200. The memory cell array 130 may include a plurality of word lines, and a plurality of memory cells 131 connected to the plurality of word lines. In some embodiments, although the memory cell 131 may be, for example, a SRAM cell including two inverters, the present disclosure is not limited thereto. For example, the memory cell 131 may be a DRAM cell. The memory cell array 130 may include a plurality of memory cells 131. The memory cell array 130 may perform a read operation or a write operation in response to the word line signal VWL applied to the word line. For example, the memory cell array 130 may perform the read operation during a first time interval of the clock cycle, and may perform the write operation during a second time interval. Here, the first time interval and the second time interval are arranged in a time series (e.g., sequentially) and may not overlap each other.

The peripheral circuit 200 may be directly connected to the memory circuit 100. The peripheral circuit 200 may transmit the signal received from the controller 300 to the memory circuit 100, and receive and process the signal as a response thereof. The peripheral circuit 200 may provide the processed signal to the controller 300.

The peripheral circuit 200 may include an address buffer 210, a clock signal generator 220, a data read/write circuit 230, the bit line precharge circuit 240, and the word line predecoder 250.

In some embodiments, the address buffer 210 may receive a read address signal ADDR_R and/or a write address signal ADDR_W from the controller 300. Here, the read address signal ADDR_R may include an address in which the data to be read from the memory cell array 130 is stored, and the write address signal ADDR_W may include an address to be written in the memory cell array 130. The address buffer 210 may buffer the read address signal ADDR_R and the write address signal ADDR_W and provide them to the word line decoder 110 and the word line predecoder 250. Here, the address buffer 210 may buffer the read address signal ADDR_R and the write address signal ADDR_W on the basis of an address clock signal ADCLK received from the clock generator 220. That is, the address buffer 210 may buffer the read address signal ADDR_R and the write address signal ADDR_W at different times from each other, and may provide the read row address signal RADDR_R and the write row address signal RADDR_W to the word line decoder 110 and the word line predecoder 250.

In some embodiments, the read row address signal RADDR_R may include a high read row address signal and a low read row address signal. The word line predecoder 250 may convert the low read row address signal into the read predeck signal PRED_R, and the word line decoder 110 may output the read word line enable signal RWLEN on the basis of the high read row address signal, and the word line driver 120 may select a word line on the basis of the read word line enable signal RWLEN and the read predeck signal PRED_R and apply the word line signal VWL to the selected word line.

The word line predecoder 250 may convert the low write row address signal into a write predeck signal PRED_W, the word line decoder 110 may output a write word line enable signal WWLEN on the basis of the high write row address signal, and the word line driver 120 may select the word line on the basis of the write word line enable signal WWLEN and the write predeck signal PRED_W and apply the word line signal VWL to the selected word line.

The clock signal generator 220 may receive a system clock signal CLK from the controller 300 and generate an internal clock signal ICLK and the address clock signal ADCLK on the basis of the system clock signal CLK. The clock signal generator 220 may provide the address clock signal ADCLK to the address buffer 210 and provide the internal clock signal ICLK to the word line predecoder 250 and the data read/write circuit 230. That is, the clock signal generator 220 may provide the internal clock signal ICLK and the address clock signal ADCLK to each element or circuit of the memory device 1 to tune the operating time point of each element or circuit.

The data read/write circuit 230 may be controlled by the controller 300. The data read/write circuit 230 may write data Din to the memory cell 131 connected to the selected word line and the selected bit line pair, or read data Dout from the memory cell 131 and provide it to the controller 300. The data read/write circuit 230 may include a write enable latch 231, a write enable circuit 232, a column decoder 233, a data latch 234, a write driver 235, a column multiplexer 236, a sense amp 237, and a data driver 238.

The write enable latch 231 may receive the write enable signal WEN from the controller 300. The write enable latch 231 may latch the write enable signal WEN and provide it to the write enable circuit 232. The write enable circuit 232 may receive the write enable signal WEN and the internal clock signal ICK, and provide the write enable signal WEN to the column decoder 233 and the write driver 235. That is, the write enable circuit 232 may enable the write operation of the data read/write circuit 230 on the basis of the write enable signal WEN. The column decoder 233 may receive the write enable signal WEN and the internal clock signal ICLK. The column decoder 233 may control the column multiplexer 236 on the basis of the write enable signal WEN. That is, when the write enable signal WEN is applied to the column decoder 233, the column multiplexer 236 may connect the memory cell array 130 and the write driver 235. As a result, the write operation may be performed. However, the embodiments of the present inventive concepts are not limited thereto, and the data read/write circuit 230 may not be controlled by the write enable signal WEN. That is, since the memory device 1 corresponds to a pseudo dual port memory device, a write operation may always be performed after the read operation of the memory device 1.

The data latch 234 may receive the data Din from the controller 300. The data latch 234 may latch the data Din and provide it to the write driver 235. The write driver 235 may write the data Din in the memory cell array 130. Here, the write driver 235 may be connected to the memory cell array 130 by a column multiplexer 236. Further, the write driver 235 may perform the write operation on the basis of the write enable signal WEN received from the write enable circuit 232. However, as discussed above, the present inventive concepts are not limited thereto, and the write driver 235 may perform the write operation even without receiving the write enable signal WEN.

The sense amp 237 may sense the data Dout stored in the memory cell array 130. The sense amp 237 may operate during a time interval different from the write driver 235. The data driver 238 may provide the controller 300 with the data Dout sensed by the sense amp 237.

The column multiplexer 236 may optionally connect one of the write driver 235 and the sense amp 237 to the memory cell array 130. That is, the column multiplexer 236 may connect one of the write driver 235 and the sense amp 237 to the memory cell array 130 at different times from each other. The column multiplexer 236 may be controlled by a control signal received from the column decoder 233. Further, the column multiplexer 236 may be coupled to the bit line precharge circuit 240.

The bit line precharge circuit 240 may be placed between the column multiplexer 236 and the memory cell array 130. The bit line precharge circuit 240 may connect the column multiplexer 236 and the memory cell array 130. The bit line precharge circuit 240 may be connected to the bit lines connected to the memory cell array 130. The bit line precharge circuit 240 may precharge the bit lines before the write operation or the read operation. A more detailed explanation of the bit line precharge circuit 240 will be provided herein.

Next, a structure of the memory cell 131 included in the memory cell array 130 and the data read/write operations will be described.

Figure 3:
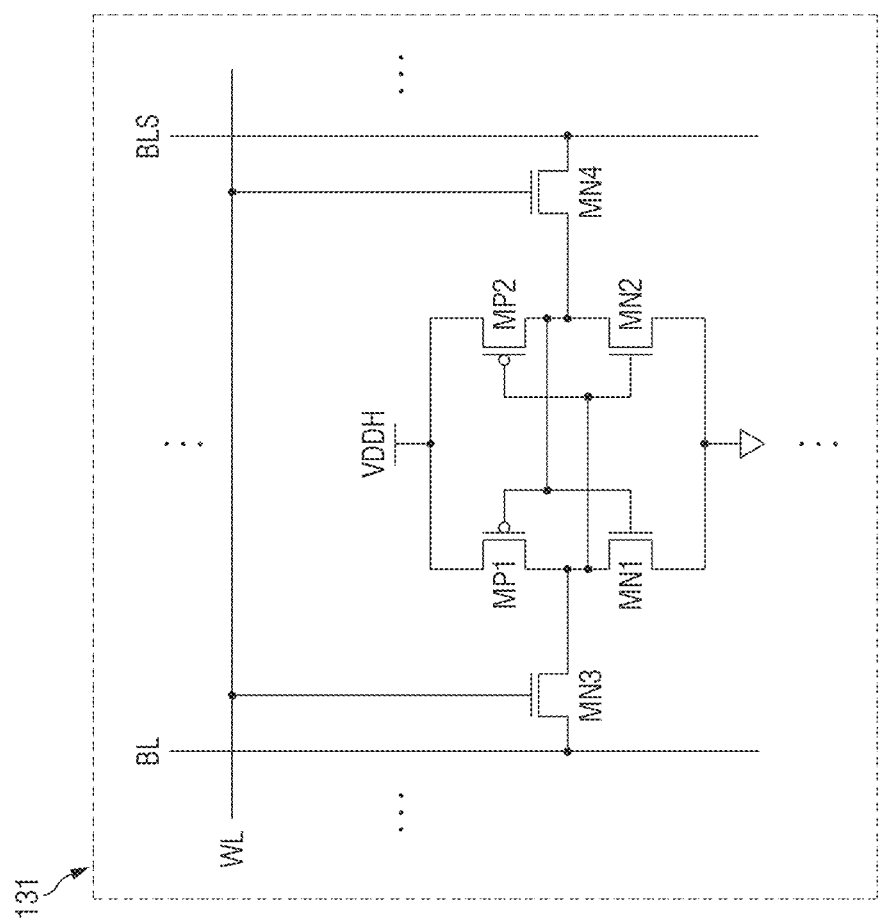
FIG. 3 is a circuit diagram showing an example configuration of the memory cell of FIG. 2.
Figure 4:
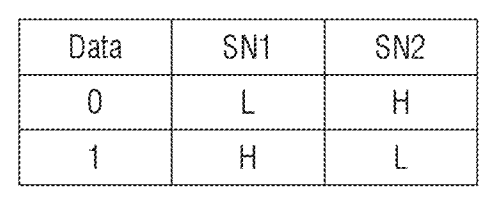
Figure 5:
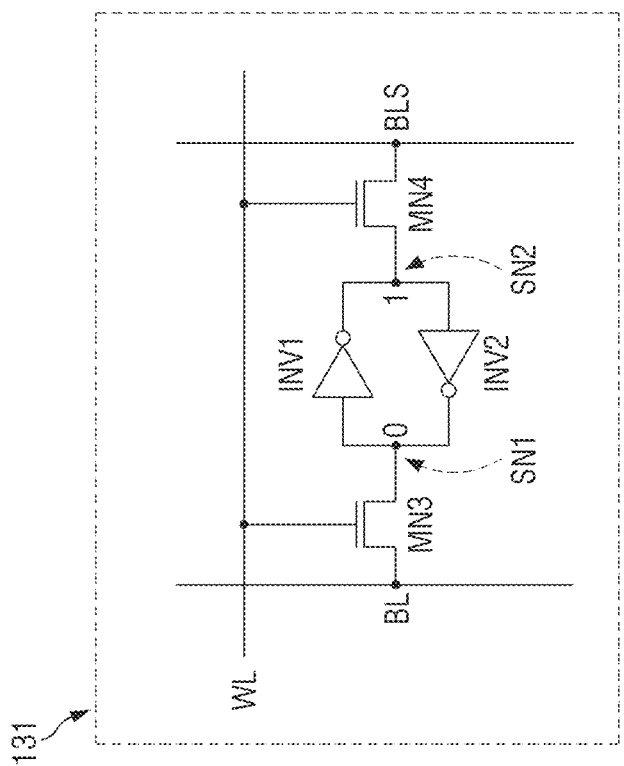
FIGS. 5 and 6 are circuit diagrams for explaining the operation of the memory cell of FIG. 3.
Figure 6:
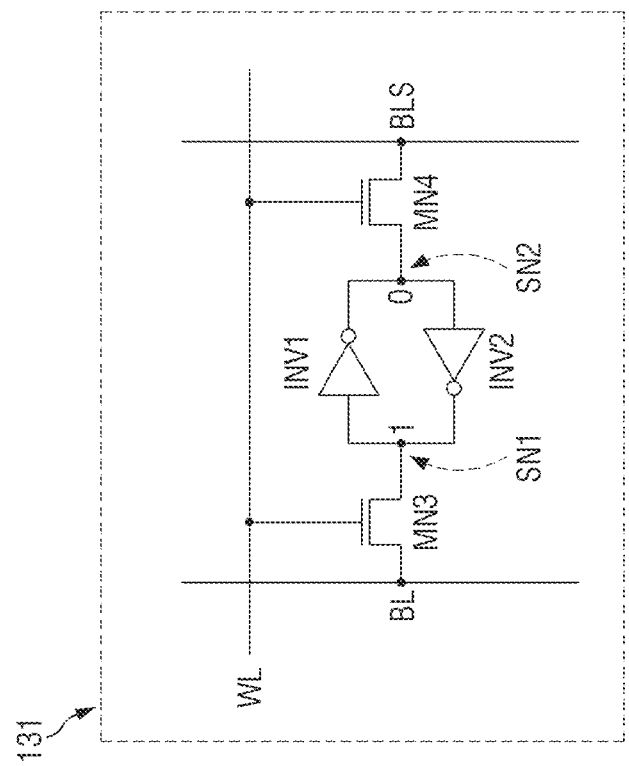

FIG. 3 is a circuit diagram showing an exemplary configuration of the memory cell of FIG. 2. FIG. 4 is a diagram for explaining the operation of the memory cell of FIG. 3. FIGS. 5 and 6 are circuit diagrams for explaining the operation of the memory cell of FIG. 3.

Referring to FIGS. 3, 5 and 6, the memory cell 131 may include a first inverter INV1 made up of a first PMOS transistor MP1 and a first NMOS transistor MN1, and a second inverter INV2 made up of a second PMOS transistor MP2 and a second NMOS transistor MN2. Further, the memory cell 131 may include a third NMOS transistor MN3 and a fourth NMOS transistor MN4 which are provided with a word line voltage as a gate voltage and serve as switches. A source of the third NMOS transistor MN3 may be connected to the bit line BL, and a drain of the third NMOS transistor MN3 may be connected to source drains of the first PMOS transistor MP1 and the first NMOS transistor MN1, and may also be connected to gates of the second PMOS transistor MP2 and the second NMOS transistor MN2. A source of the fourth NMOS transistor MN4 may be connected to the bit line BL, and a drain of the fourth NMOS transistor MN4 may be connected to the source drains of the second PMOS transistor MP2 and the second NMOS transistor MN2, and may also be connected to the gates of the first PMOS transistor MP1 and the first NMOS transistor MN1.

The memory cell 131 may use a high voltage VDDH as a cell voltage. That is, the high voltage VDDH may be provided to a common source terminal of the first PMOS transistor MP1 and the second PMOS transistor MP2. Therefore, the memory cell 131 may be supplied with a relatively high voltage VDDH as compared with the low voltage regardless of the operating mode of the memory device 1.

The first inverter INV1 and the second inverter INV2 form a latch circuit, and the latch circuit is provided with the high voltage VDDH, and may maintain data by the high voltage VDDH. In FIG. 3, although the third and fourth NMOS transistors MN3 and MN4 are each made up of NMOS transistors that are turned on to the word line drive voltage of a high level, the embodiments are not limited thereto. In some embodiments according to the inventive concepts of the present disclosure, the third and fourth NMOS transistors MN3 and MN4 may each be made up of a PMOS transistor that is turned on to the word line voltage of a low level. Here, the memory cell 131 may correspond to a SRAM memory cell, and the memory cell array 130 may correspond to a pseudo dual port SRAM.

The operation of the memory cell 131 will be described referring to FIGS. 4 to 6. FIG. 4 exemplarily defines the data stored in the memory cell 131 for explaining the operation of the memory cell 131. When a voltage level of a first node SN1 of the memory cell 131 is a low level, and a voltage level of a second node SN2 is a high level, it may be defined that data "0" is stored in the memory cell 131. Further, when the voltage level of the first node SN1 is a high level and the voltage level of the second node SN2 is a low level, it may be defined that data "1" is stored in the memory cell 131. However, the present disclosure is not limited thereto, and when the voltage level of the first node SN1 is a low level, and the voltage level of the second node SN2 is a high level, it may be defined that data "1" is stored in the memory cell 131.

Referring to FIGS. 5 and 6, a latch circuit made up of a pair of inverters INV1 and INV2 may store the data. At the time of the read operation on the memory cell 131, the memory cell array 130 may transmit to the output terminal whether the data stored in the memory cell 131 is "0" or "1".

The read operation of the memory cell 131 will be described. After the bit line BL and the complementary bit line BLS are precharged to a specific voltage, the word line signal VWL becomes "1", and the first node SN1 and the second node SN2 of the memory cell 131 may each be connected to the bit line BL and the complementary bit line BLS. Subsequently, the voltage of the bit line BL and the complementary bit line BLS may be changed depending on the data stored in the memory cell 131, and the sense amp 237 may sense a voltage difference between the bit line BL and the complementary bit line and transmit the data Dout to the data driver 238.

The write operation of the memory cell 131 will be described. After the bit line BL and the complementary bit line BLS are precharged to a specific voltage, the word line signal VWL becomes "1", and the first node SN1 and the second node SN2 of the memory cell 131 may each be connected to the bit line BL and the complementary bit line BLS. The write driver 235 is connected to the bit line BL and the complementary bit line BLS by the column multiplexer 236, and the write driver 235 may change a voltage difference between the first node SN1 and the second node SN2 of the memory cell 131 to write the data Din to the memory cell 131. Such a read operation and a write operation of the memory device 1 are merely examples, and the embodiments of the present inventive concepts are not limited thereto.

Hereinafter, a column line COL, a write driver 235, and a sense amp 237 that perform precharging according to some embodiments will be described referring to FIGS. 7 to 11.

Figure 7:
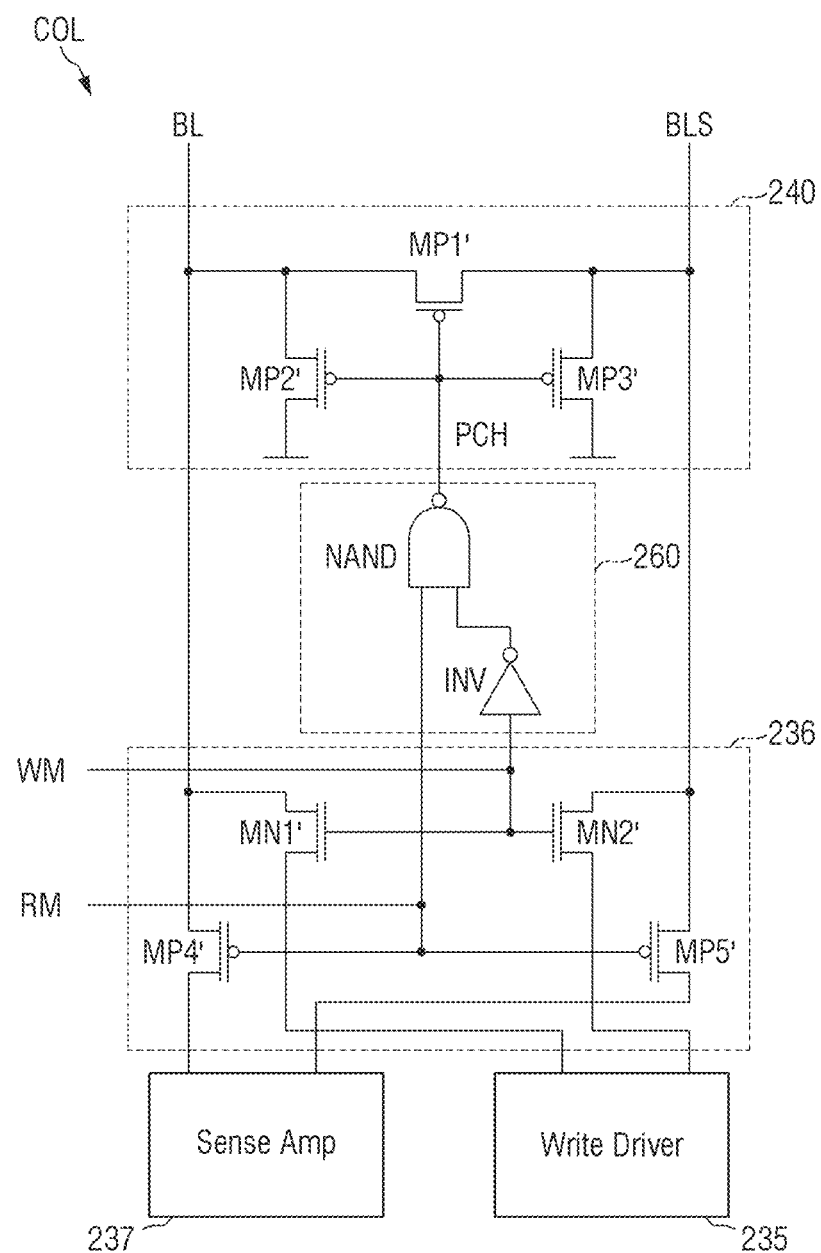
FIG. 7 is a diagram for explaining a column line, a write driver and a sense amp which perform the precharge according to some embodiments.

FIG. 7 is a diagram for explaining a column line, a write driver and a sense amp which perform the precharge according to some embodiments.

Referring to FIG. 7, the column line COL may include a bit line BL, a complementary bit line BLS, a column multiplexer 236, a bit line precharge circuit 240, and a precharge control signal generation circuit 260. The column line COL may be defined by a bit line pair including the bit line BL and the complementary bit line BLS, and the memory device 1 may include a plurality of column lines COL. Here, the column line COL may be included in a part of the memory cell array 130, the bit line precharge circuit 240, and the data read/write circuit 230 of FIG. 2, although the inventive concepts are not limited thereto and may include other configurations.

The column multiplexer 236 may be connected to the write driver 235 and the sense amp 237. The column multiplexer 236 may receive a write multiplexer control signal WM and a read multiplexer control signal RM from the column decoder 233. The column decoder 233 may connect the write driver 235 to the bit line pairs BL and BLS on the basis of the write multiplexer control signal WM, and may connect the sense amp 237 and the bit line pairs BL and BLS on the basis of the read multiplexer control signal RM. That is, the column multiplexer 236 may selectively connect the bit line pairs BL and the BLS to the write driver 235 and the sense amp 237 according to the write multiplexer control signal WM and the read multiplexer control signal RM.

The column multiplexer 236 may include a first NMOS transistor MN1', a second NMOS transistor MN2', a fourth PMOS transistor MP4', and a fifth PMOS transistor MP5'.

The write multiplexer control signal WM may be applied to the node to which the gate of the first NMOS transistor MN1' and the gate of the second NMOS transistor MN2' are connected. First source/drains of the first NMOS transistor MN1' and the second NMOS transistor MN2' may be connected respectively to the bit line BL and complementary bit line BLS, and second source/drains of the first NMOS transistor MN1' and the second NMOS transistor MN2' may be connected to the write driver 235. The first NMOS transistor MN1' and the second NMOS transistor MN2' may be turned on or off on the basis of the write multiplexer control signal WM. The gates of the first NMOS transistor MN1' and the second NMOS transistor MN2' may be connected to the precharge control signal generation circuit 260.

The read multiplexer control signal RM may be applied to the node to which the gate of the fourth PMOS transistor MP4' and the gate of the fifth PMOS transistor MP5' are connected. First source/drains of the fourth PMOS transistor MP4' and the fifth PMOS transistor MP5' may be connected respectively to the bit line BL and complementary bit line BLS, and second source/drains of the fourth PMOS transistor MP4' and the fifth PMOS transistor MP5' may be connected to the sense amp 237. The fourth PMOS transistor MP4' and the fifth PMOS transistor MP5' may be turned on or off on the basis of the read multiplexer control signal RM. The gates of the fourth PMOS transistor MP4' and the fifth PMOS transistor MP5' may be connected to the precharge control signal generation circuit 260.

The bit line precharge circuit 240 may be connected to both the bit line BL and the complementary bit line BLS of the bit line pair. Specifically, the bit line precharge circuit 240 may include a first PMOS transistor MP1', a second PMOS transistor MP2', and a third PMOS transistor MP3'. A first source/drain of the first PMOS transistor MP1' may be connected to a first of the bit line BL and the complementary bit line BLS, and a second source/drain of the first PMOS transistor MP1' may be connected to a second of the bit line BL and the complementary bit line BLS. A first source/drain of the second PMOS transistor MP2' may be connected to the bit line BL, and the second source/drain may be connected to a ground voltage. A first source/drain of the third PMOS transistor MP3' may be connected to the complementary bit line BLS, and the second source/drain may be connected to the ground voltage. The gates of the first PMOS transistor MP1', the second PMOS transistor MP2', and the third PMOS transistor MP3' may be connected in common, and all may be connected to the precharge control signal generation circuit 260. That is, the first PMOS transistor MP1', the second PMOS transistor MP2', and the third PMOS transistor MP3' may receive the precharge control signal PCH from the precharge control signal generation circuit 260. The bit line precharge circuit 240 may perform a precharge operation on the bit line pairs BL and BLS on the basis of the precharge control signal PCH.

The precharge control signal generation circuit 260 may connect the column multiplexer 236 and the bit line precharge circuit 240. The precharge control signal generation circuit 260 may receive the write multiplexer control signal WM and/or the read multiplexer control signal RM from the column multiplexer 236, and may generate the precharge control signal PCH on the basis of the received write multiplexer control signal WM and/or read multiplexer control signal RM. Therefore, the precharge control signal PCH may be generated by the combination of the write multiplexer control signal WM and the read multiplexer control signal RM. That is, the operation of the bit line precharge circuit 240 may be synchronized by the write multiplexer control signal WM and the read multiplexer control signal RM. The bit line precharge circuit 240 may not receive any control signal other than the precharge control signal PCH.

The precharge control signal generation circuit 260 may include an inverter INV that receives a write multiplexer control signal WM and outputs an inverted signal, and a NAND logic element NAND that executes a NAND operation on the read multiplexer control signal RM and the inverted write multiplexer control signal WM. The NAND logic element NAND may output the precharge control signal PCH. By generating the precharge control signal PCH on the basis of the read multiplexer control signal RM and the write multiplexer control signal WM, the signal stability of the precharge control signal PCH may increase. Therefore, it may be possible to provide the memory device 1 having improved signal stability.

Next, the operation of the column line COL will be described referring to FIGS. 8 and 9.

Figure 8:
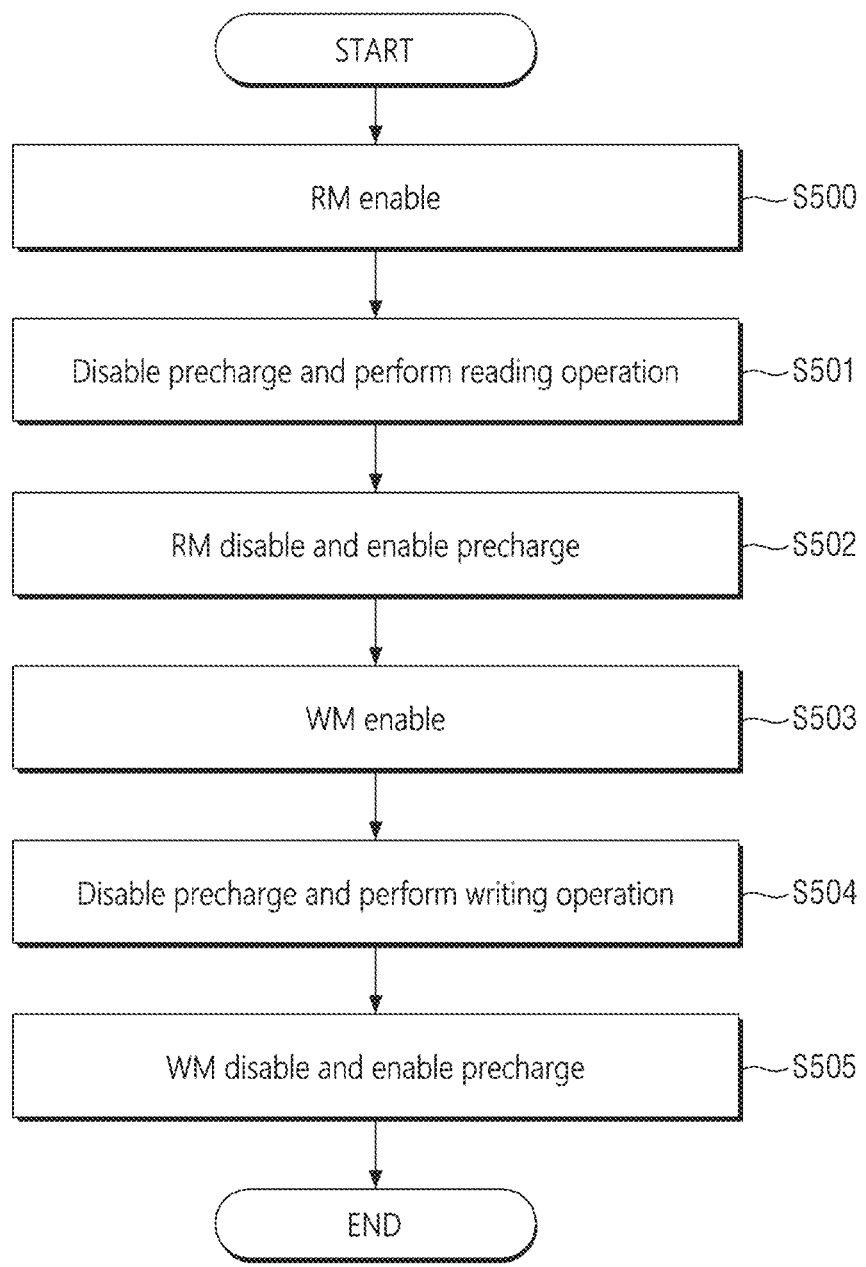
FIG. 8 is a flowchart for explaining the operation of the column line of FIG. 7.

FIG. 8 is a flowchart for explaining the operation of the column line of FIG. 7. FIG. 9 is a timing diagram for explaining the operation of the column line of FIG. 7.

Figure 9:
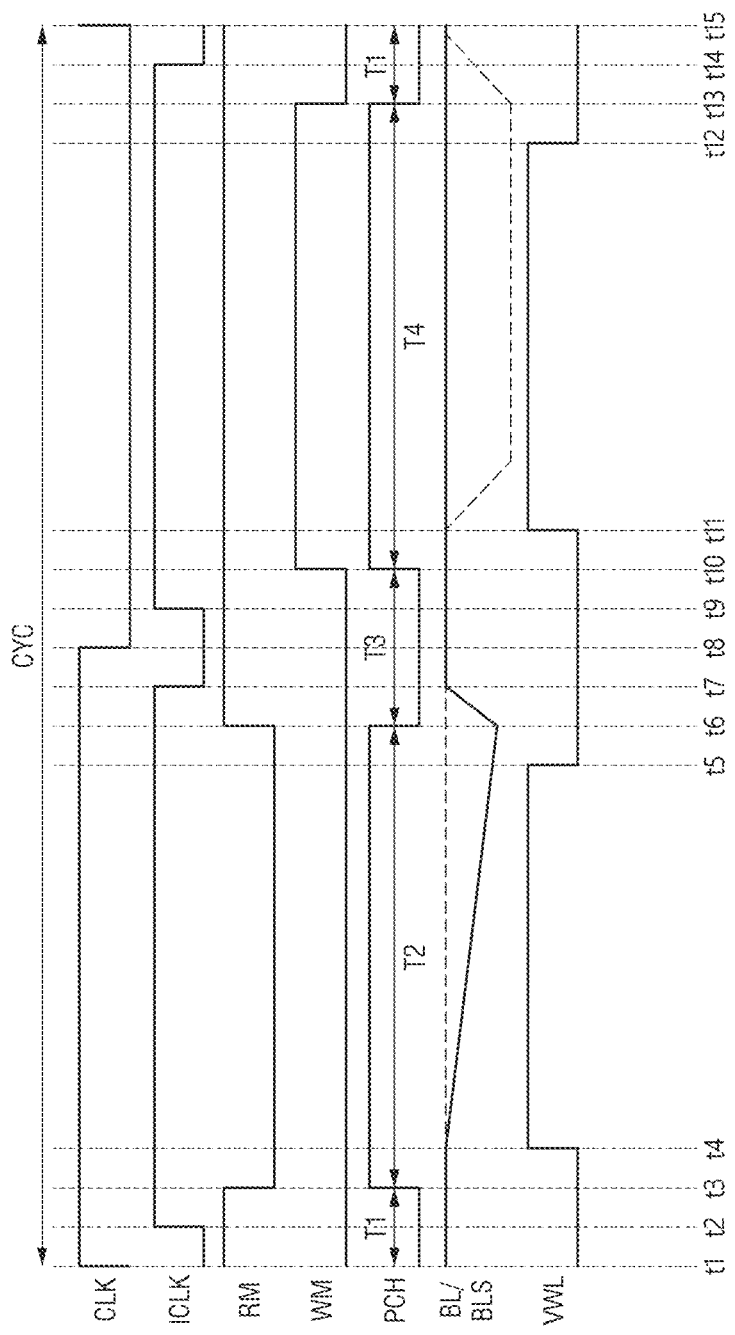
FIG. 9 is a timing diagram for explaining the operation of the column line of FIG. 7.

Referring to FIGS. 7 to 9, the system clock signal CLK may have a clock cycle CYC. That is, the system clock signal CLK may have one rising edge and one falling edge during the clock cycle CYC. The clock signal generator 220 may generate the internal clock signal ICLK on the basis of the system clock signal CLK. In some embodiments, the internal clock signal ICLK may be generated by being triggered from the system clock signal CLK. The system clock signal CLK may have a clock cycle CYC corresponding to a time interval from a first time t1 to a fifteenth time t15. The system clock signal CLK may have a logic high level during the time interval from the first time t1 to an eighth time t8, and may have a logic low level during the time interval from the eighth time t8 to a fifteenth time t15. The system clock signal ICLK may have a logic high level between the time interval from the second time t2 to a seventh time t7 and the time interval from a ninth time t9 to a fourteenth time t14.

First, the read multiplexer control signal RM may be enabled (S500). The read multiplexer control signal RM may be generated by being triggered from the internal clock signal ICLK. The read multiplexer control signal RM may have a logic low level during the time interval from a third time t3 to a sixth time t6, and has a logic high level during the other time intervals. At this time, the write multiplexer control signal WM has a logic low level during the time interval from the third time t3 to the sixth time t6. By applying the read multiplexer control signal RM to the column multiplexer 236, the sense amp 237 may perform the read operation.

The bit line precharge circuit 240 may disable precharge, and the sense amp may perform the read operation (S501). The precharge control signal generation circuit 260 may generate a logic high precharge control signal PCH in response to the logic low read multiplexer control signal RM. The bit line precharge circuit 240 may disable precharge of the bit line pair BL and BLS on the basis of the precharge control signal PCH. The bit line precharge circuit 240 may precharge the bit line pair BL and BLS during the first time interval T1 corresponding to the first time t1 to the third time t3, and the bit line precharge circuit 240 may not precharge the bit line pair BL and BLS during the second time interval T2 corresponding to the third time t3 to the sixth time t6. As a result, the read operation of the memory cell 131 may be ready to be performed.

The sense amp 237 may be connected to the bit line pair BL and BLS by the column multiplexer 236, and may perform the read operation of the memory cell 131 within the second time interval T2. As the word line signal VWL is applied to the word line during the fourth time t4 and the fifth time t5, a voltage difference between the bit line BL and the complementary bit line BLS may increase. Since the bit line pair BL and BLS are not precharged, the voltage difference may gradually increase. The sense amp 237 may sense the voltage difference and output the data Dout.

After the read operation ends, the read multiplexer control signal RM may be disabled and the bit line precharge circuit 240 may enable the precharge (S502). As the read multiplexer control signal RM reaches the logic high level, the precharge control signal PCH may become the logic low level. The bit line precharge circuit 240 that receives the precharge control signal PCH of the logic low level may precharge the bit line pairs BL and BLS during the third time interval T3. Here, the third time interval T3 may correspond to the sixth time t6 to a tenth time t10. The read multiplexer control signal RM may maintain a logic high level during the time interval between the sixth time t6 and the fifteenth time t15. As the bit line pair BL and BLS are precharged, the voltage difference between the bit line pair BL and BLS may be reduced to zero. Further, the voltage level of the word line signal VWL may be logic low during the fifth time t5 to the eleventh time tn.

Subsequently, the write multiplexer control signal WM may be enabled (S503). The write multiplexer control signal WM may be generated by being triggered from the internal clock signal ICLK. The write multiplexer control signal WM may have a logic high level during the time interval from the tenth time t10 to the thirteenth time t13, and may have a logic low level during the other time intervals. At this time, the read multiplexer control signal RM may have a logic high level during the time interval from the tenth time t10 to the thirteenth time t13. By applying the write multiplexer control signal WM to the column multiplexer 236, the write driver 235 may perform the write operation.

The bit line precharge circuit 240 may disable the precharge, and the write driver 235 may perform the write operation (S504). The precharge control signal generation circuit 260 may generate a logic high precharge control signal PCH in response to the logic high write multiplexer control signal WM. The bit line precharge circuit 240 may disable precharge of the bit line pair BL and BLS on the basis of the precharge control signal PCH.

The bit line precharge circuit 240 may precharge the bit line pair BL and BLS during the third time interval T3 corresponding to the sixth time t6 to the tenth time t10, and the bit line precharge circuit 240 may not precharge the bit line pair BL and BLS during the fourth time interval T4 corresponding to the tenth time t10 to the thirteenth time t13. Accordingly, the write operation of the memory cell 131 may be ready to be performed.

The write driver 235 may be connected to the bit line pair BL and BLS by the column multiplexer 236, and may perform the write operation on the memory cell 131 within the fourth time interval T4. As the word line signal VWL is applied to the word line during the eleventh time t11 to the twelfth time t12, the voltage difference between the bit line BL and the complementary bit line BLS may increase. Since the bit line pair BL and BLS are not precharged, the voltage difference may increase. The write driver 235 may write data Din to the memory cell MC, using the voltage difference between the bit line pair BL and BLS.

After the write operation ends, the write multiplexer control signal WM may be disabled and the bit line precharge circuit 240 may enable the precharge (S505). As the write multiplexer control signal WM reaches the logic low level, the precharge control signal PCH may become the logic low level. The bit line precharge circuit 240 that receives the precharge control signal PCH of the logic low level may precharge the bit line pair BL and BLS during the first time interval T1. Here, the first time interval T1 may correspond to the thirteenth time t13 to the fifteenth time t15. The write multiplexer control signal WM may maintain a logic low level during the time interval from the first time t1 to the tenth time t10 and from the thirteenth time t13 to the fifteenth time t15. Since the bit line pair BL and BLS are precharged, a voltage difference between the bit line pair BL and BLS may be reduced to zero. Further, the voltage level of the word line signal VWL may be logic low between the twelfth time t12 and the fifteenth time t15.

As described above, the bit line precharge circuit 240 may operate based on the precharge control signal PCH generated on the basis of the write multiplexer control signal WM and the read multiplexer control signal RM. Because the bit line precharge circuit 240 operates by the precharge control signals PCH that are different from each other for each column line COL, without using the global precharge control signal, it may be possible to provide the memory device 1 in which the signal stability increases.

Figure 10:
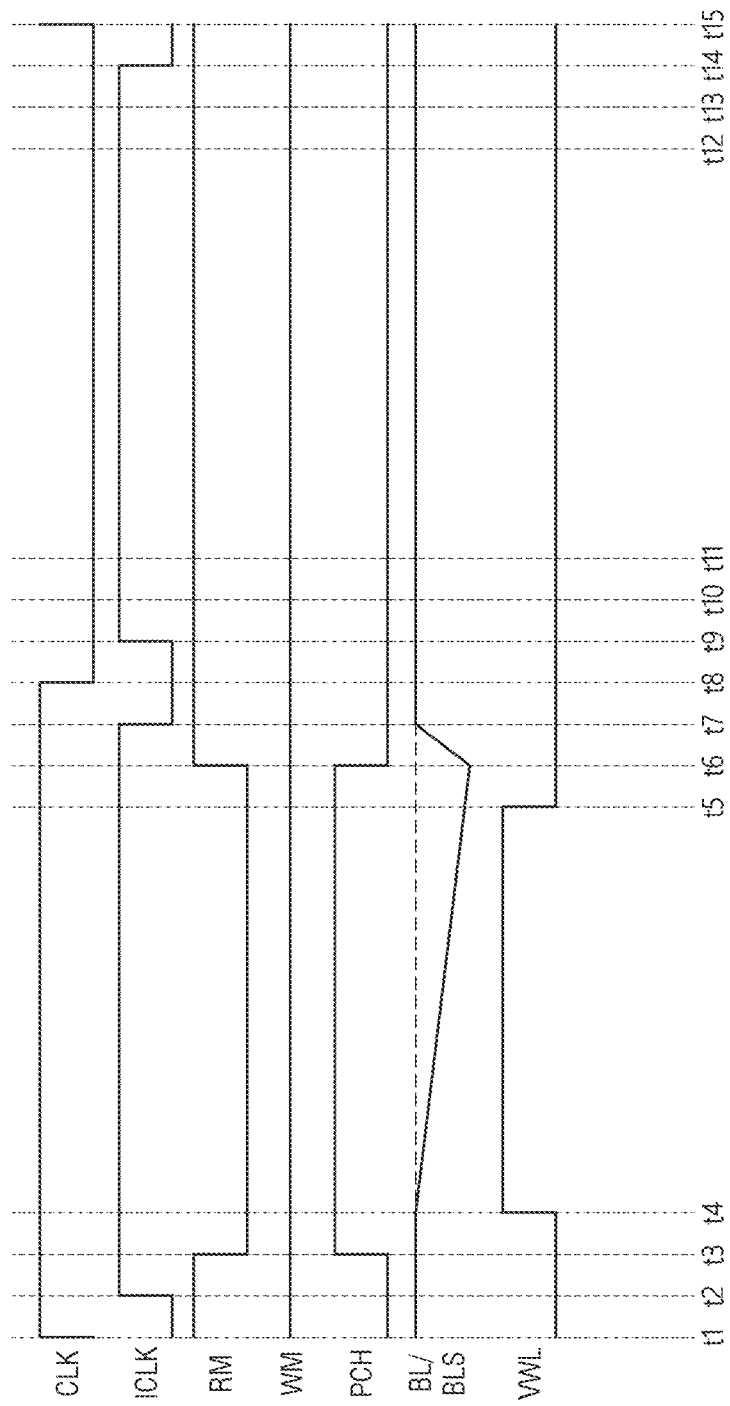
FIG. 10 is a timing diagram for explaining the operation of the column line of FIG. 7.

FIG. 10 is a timing diagram for explaining the operation of the column line of FIG. 7.

Referring to FIGS. 7 and 10, the column multiplexer 236 may receive the read multiplexer control signal RM and the write multiplexer control signal WM. At this time, the read multiplexer control signal RM may have a logic low level during the third time t3 to the sixth time t6, and may have a logic high level during the remaining time of the clock cycle CYC. The write multiplexer control signal WM may have a logic low level throughout the clock cycle CYC. That is, the memory device 1 may perform only the read operation on the memory cell 131 during the clock cycle CYC, and does not perform the write operation. Here, the read operation of the memory cell 131 may be performed when the system clock signal CLK is the logic high level, but the write operation of the memory cell 131 is not performed when the system clock signal CLK is the logic low level.

The read multiplexer control signal RM may be transmitted to the column multiplexer 236 and the precharge control signal generation circuit 260, the precharge control signal generation circuit 260 may generate the precharge control signal PCH on the basis of the read multiplexer control signal RM, and the bit line precharge circuit 240 may interrupt the precharge operation of the bit line pair BL and BLS in response to the precharge control signal PCH. Further, the sense amp 237 may be connected to the bit line pair BL and BLS through the column multiplexer 236, and may perform the read operation on the memory cell 131.

Figure 11:
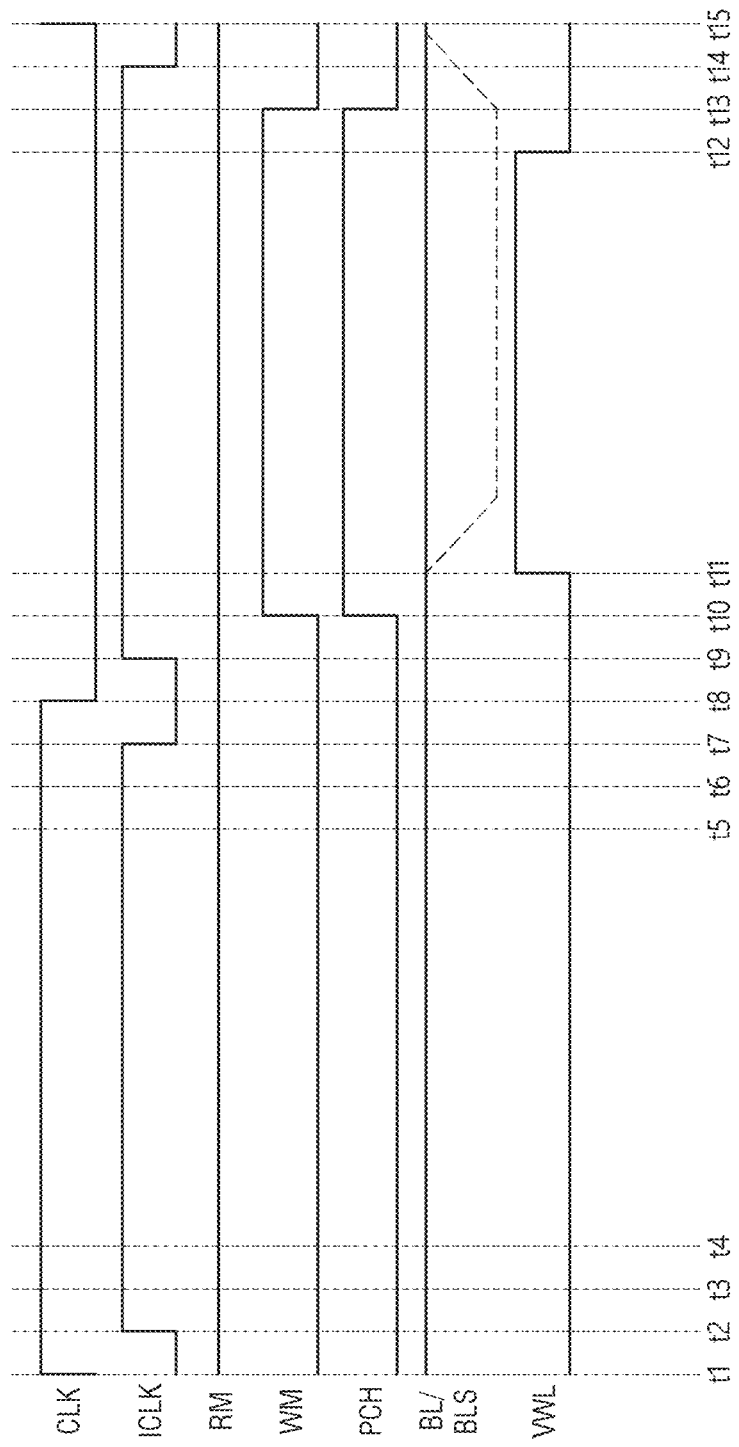
FIG. 11 is a timing diagram for explaining the operation of the column line of FIG. 7.

FIG. 11 is a timing diagram for explaining the operation of the column line of FIG. 7.

Referring to FIGS. 7 and 11, the column multiplexer 236 may receive the read multiplexer control signal RM and the write multiplexer control signal WM. At this time, the write multiplexer control signal WM may have a logic high level during the tenth time t10 to the time t13, and may have a logic low level during the remaining times of the clock cycle CYC. The read multiplexer control signal RM has a logic high level throughout the clock cycle CYC. That is, the memory device 1 may perform only the write operation on the memory cell 131 during the clock cycle CYC, but does not perform the read operation. Here, the write operation on the memory cell 131 may be performed when the system clock signal CLK is the logic low level, but the read operation on the memory cell 131 is not performed when the system clock signal CLK is the logic high level.

The write multiplexer control signal WM may be transmitted to the column multiplexer 236 and the precharge control signal generation circuit 260, the precharge control signal generation circuit 260 may generate the precharge control signal PCH on the basis of the write multiplexer control signal WM, and the bit line precharge circuit 240 may interrupt the precharge operation on the bit line pair BL and BLS in response to the precharge control signal PCH. Further, the write driver 235 may be connected to the bit line pair BL and BLS through the column multiplexer 236, and may perform the write operation on the memory cell 131.

Hereinafter, a memory device 1 according to some embodiments will be described referring to FIGS. 12 to 14.

Figure 12:
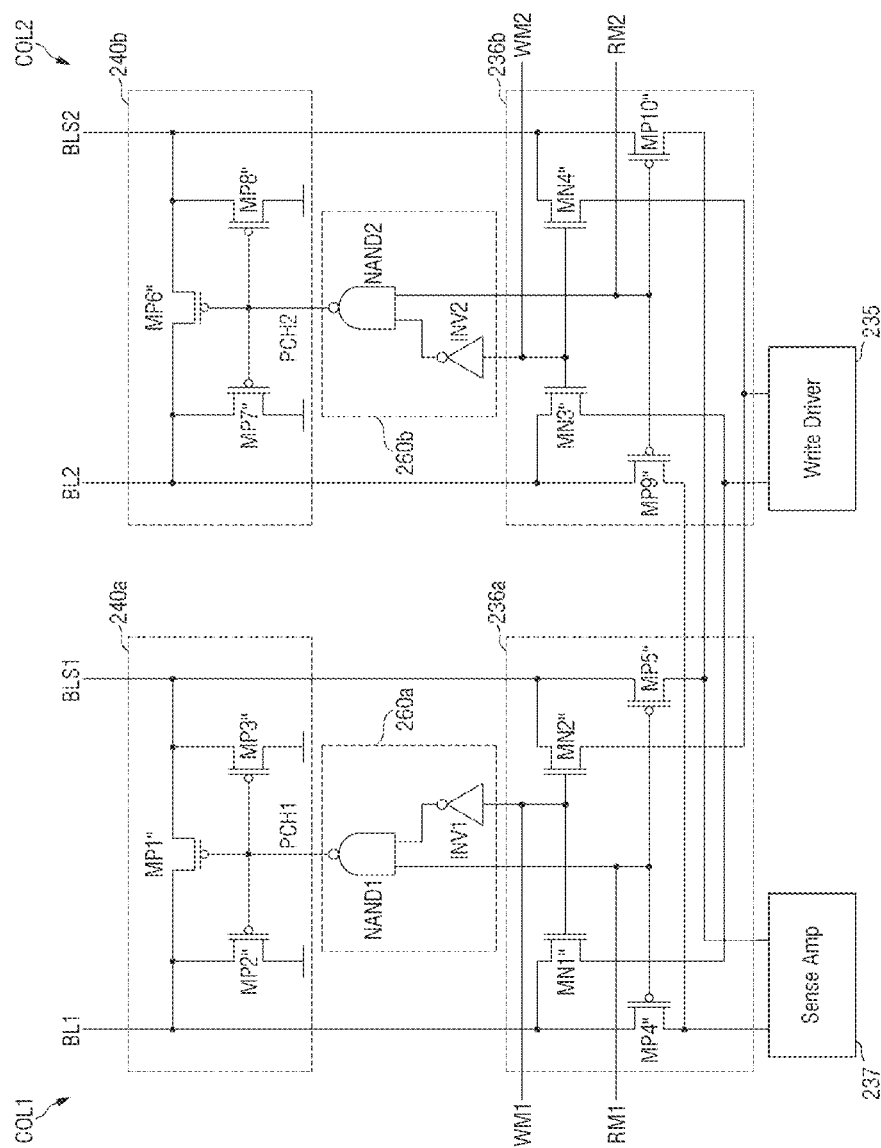
FIG. 12 is a diagram for explaining a plurality of column lines which perform precharge according to some embodiments.

FIG. 12 is a diagram for explaining a plurality of column lines which perform precharge according to some embodiments. FIG. 13 is a flowchart for explaining the operations of the plurality of column lines of FIG. 12. FIG. 14 is a timing diagram for explaining the operation of the plurality of column lines according to FIGS. 12 and 13. For convenience of explanation, repeated parts of contents explained with reference to FIGS. 1 to 11 will be only briefly described or omitted.

Referring to FIG. 12, the memory device 1 may include a first column line COL1, a second column line COL2, a write driver 235, and a sense amp 237. The first column line COL1 may be connected to the memory cells 131 (e.g., first memory cells 131) in the memory cell array 130, and the second column line COL2 may be connected to other memory cells 131 (e.g., second memory cells 131) in the memory cell array 130.

The first column line COL1 may include a first bit line BL1, a first complementary bit line BLS1, a first column multiplexer 236a, a first bit line precharge circuit 240a, and a first precharge control signal generation circuit 260a. The second column line COL2 may include a second bit line BL2, a second complementary bit line BLS2, a second column multiplexer 236b, a second bit line precharge circuit 240b, and a second precharge control signal generation circuit 260b. The first column line COL1 may be defined by a first bit line pair including the first bit line BL1 and the first complementary bit line BLS1, and the second column line COL2 may be defined by a second bit line pair including the second bit line BL2 and the second complementary bit line BLS2.

The first column multiplexer 236a may include a first NMOS transistor MN1", a second NMOS transistor MN2", a fourth PMOS transistor MP4", and a fifth PMOS transistor MP5". The first column multiplexer 236a may connect the first bit line pair BL1 and BLS1 to the write driver 235 on the basis of a first write multiplexer control signal WM1, and may connect the first bit line pair BL1 and BLS1 to the sense amp 237 on the basis of a first read multiplexer control signal RM1.

The first bit line precharge circuit 240a may be connected to both the first bit line BL1 and the first complementary bit line BLS1 of the first bit line pair BL1 and BLS1. The first bit line precharge circuit 240a may include a first PMOS transistor MP1", a second PMOS transistor MP2", and a third PMOS transistor MP3". The first bit line precharge circuit 240a may perform a precharge operation on the first bit line pair BL1 and BLS1 on the basis of the first precharge control signal PCH1.

The first precharge control signal generation circuit 260a may connect the first column multiplexer 236a and the first bit line precharge circuit 240a. The first precharge control signal generation circuit 260a may include a first NAND logic element NAND1 and a first inverter INV1. The first precharge control signal generation circuit 260a may generate the first precharge control signal PCH1 on the basis of the first write multiplexer control signal WM1 and the first read multiplexer control signal RM1.

The second column multiplexer 236b may include a third NMOS transistor MN3", a fourth NMOS transistor MN4", a ninth PMOS transistor MP9", and a tenth PMOS transistor MP10". The second column multiplexer 236b may connect the second bit line pair BL2 and BLS2 to the write driver 235 on the basis of a second write multiplexer control signal WM2, and may connect the second bit line pair BL2 and BLS2 to the sense amp 237 on the basis of a second read multiplexer control signal RM2.

The second bit line precharge circuit 240b may be connected to both the second bit line BL2 and the second complementary bit line BLS2 of the second bit line pair BL2 and BLS2. The second bit line precharge circuit 240b may include a sixth PMOS transistor MP6", a seventh PMOS transistor MP7", and an eighth PMOS transistor MP8". The second bit line precharge circuit 240b may perform the precharge operation on the second bit line pair BL2 and BLS2 on the basis of the second precharge control signal PCH2.

The second precharge control signal generation circuit 260b may connect the second column multiplexer 236b and the second bit line precharge circuit 240b. The second precharge control signal generation circuit 260b may include a second NAND logic element NAND2 and a second inverter INV2. The second precharge control signal generation circuit 260b may generate the second precharge control signal PCH2 on the basis of the second write multiplexer control signal WM2 and the second read multiplexer control signal RM2.

In some embodiments, the first precharge control signal PCH1 may be generated on the basis of the first write multiplexer control signal WM1 and the first read multiplexer control signal RM1, and the second precharge control signal PCH2 may be generated on the basis of the second write multiplexer control signal WM2 and the second read multiplexer control signal RM2. That is, each of the first bit line precharge circuit 240a and the second bit line precharge circuit 240b may operate on the basis of the first precharge control signal PCH1 and the second precharge control signal PCH2 that are different from each other. The first bit line precharge circuit 240a and the second bit line precharge circuit 240b are not controlled by the global precharge control signal but may operate independently. Further, the write operation and the read operation of each column line may be performed independently. Therefore, the memory device 1 may operate at a faster operating frequency.

Figure 13:
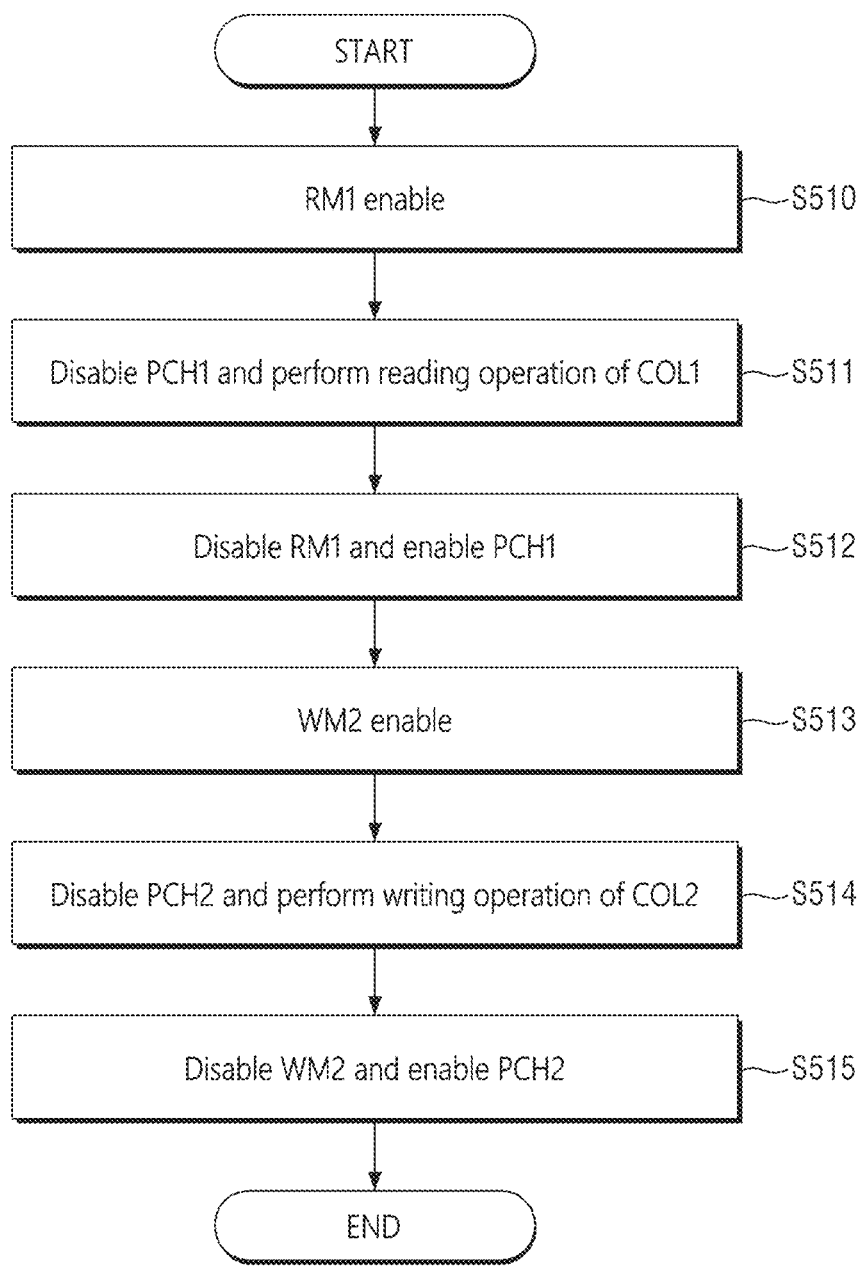
FIG. 13 is a flowchart for explaining the operations of the plurality of column lines of FIG. 12.
Figure 14:
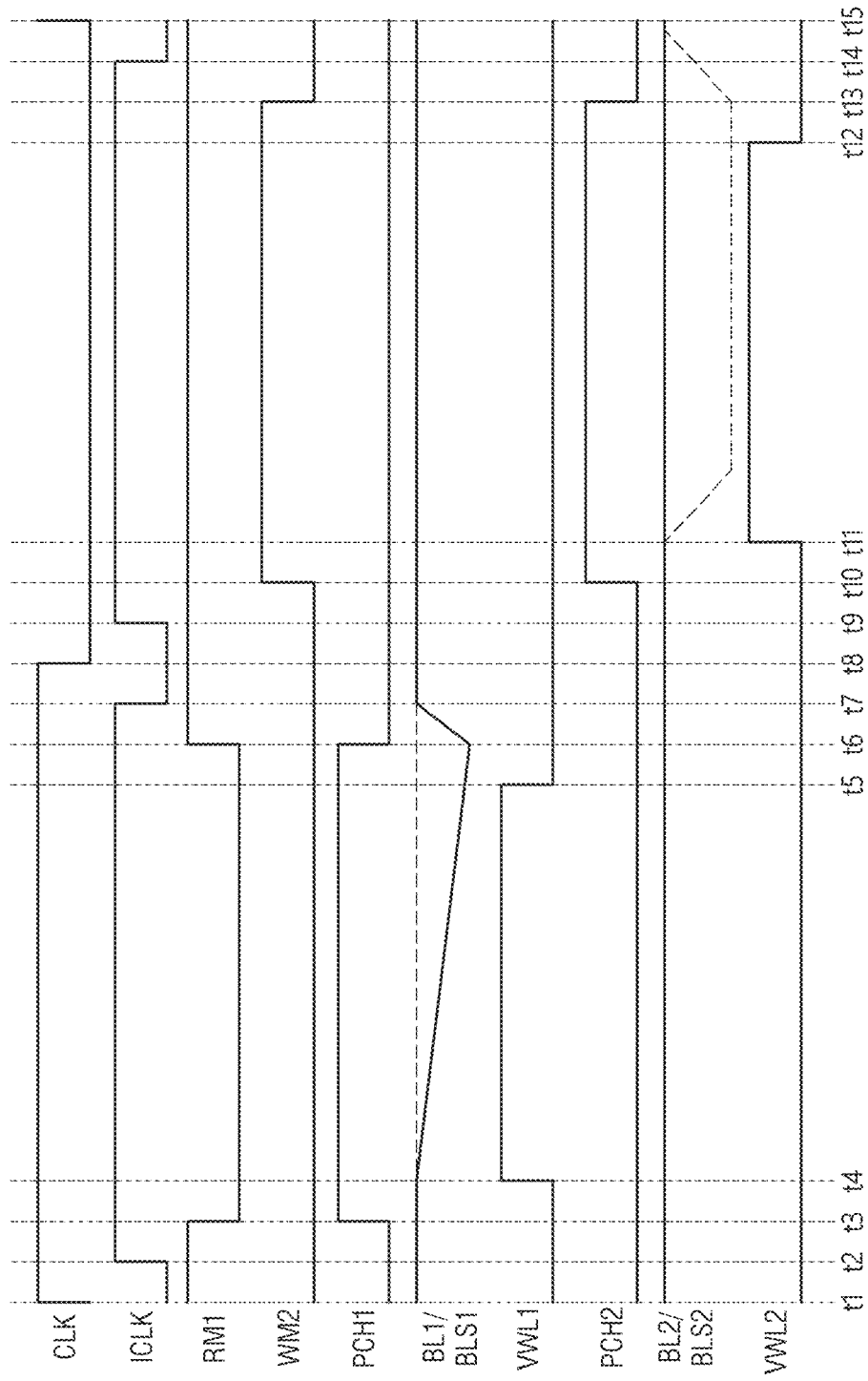
FIG. 14 is a timing diagram for explaining the operation of the plurality of column lines according to FIGS. 12 and 13.

Referring to FIGS. 12 to 14, the first read multiplexer control signal RM1 may be enabled (S510). The first read multiplexer control signal RM1 applied to the first column line COL1 may have a logic low level during the time interval from the third time t3 to the sixth time t6. The first precharge control signal generation circuit 260*a* may generate the first precharge control signal PCH1 on the basis of the first read multiplexer control signal RM1. The first precharge control signal PCH1 may have a logic high level during the time interval from the third time t3 to the sixth time t6.

The first bit line precharge circuit 240*a* may disable the precharge, and the sense amp 237 may perform the read operation (S511). The first bit line precharge circuit 240*a* may disable the precharge of the first bit line pair BL1 and BLS1 in response to the first precharge control signal PCH1. Further, the sense amp 237 may perform the read operation on the memory cell 131 connected to the first bit line BL1 and the first complementary bit line BLS1 during the time interval from the fourth time t4 to the fifth time t5. While the first column line COL1 performs the read operation, the second column line COL2 may not perform the write operation or the read operation.

Subsequently, the first read multiplexer control signal RM1 may be disabled and the first precharge control signal PCH1 may be enabled (S512). The first bit line pair BL1 and BLS1 may maintain the precharge during the time interval after the sixth time t6.

The second write multiplexer control signal WM2 may be enabled (S513). The second write multiplexer control signal WM2 applied to the second column line COL2 may have a logic high level during the time interval from the tenth time t10 to the thirteenth time t13. The second precharge control signal generation circuit 260*b* may generate the second precharge control signal PCH2 on the basis of the second write multiplexer control signal WM2. The second precharge control signal PCH2 may have a logic high level during the time interval from the tenth time t10 to the thirteenth time t13.

The second bit line precharge circuit 240*b* may disable precharge, and the write driver 235 may perform the write operation (S514). The second bit line precharge circuit 240*b* may disable the precharge of the second bit line pair BL2 and BLS2 in response to the second precharge control signal PCH2. Further, the write driver 235 may perform the write operation on the memory cell 131 connected to the second bit line BL2 and the second complementary bit line BLS2 during the time interval from the eleventh time t11 to the twelfth time t12. While the second column line COL2 performs the write operation, the first column line COL1 may not perform the write operation or the read operation.

Subsequently, the second write multiplexer control signal WM2 may be disabled, and the second precharge control signal PCH2 may be enabled (S515). The second bit line pair BL2 and BLS2 may maintain the precharge during the time interval of the first time t1 to the tenth time t10.

Therefore, the first bit line precharge circuit 240*a* controlled by the first precharge control signal generation circuit 260*a* of the first column line COL1, and the second bit line precharge circuit 240*b* controlled by the second precharge control signal generation circuit 260*b* of the second column line COL2 may operate independently. That is, the precharge operation on the bit line of a specific column line does not depend on the precharge operation on the bit lines of another column line. Accordingly, it may be possible to provide the memory device 1 which has improved signal integrity and operates at a high operating frequency.

Hereinafter, a memory device 1 according to some embodiments will be described referring to FIGS. 15 and 16.

Figure 15:
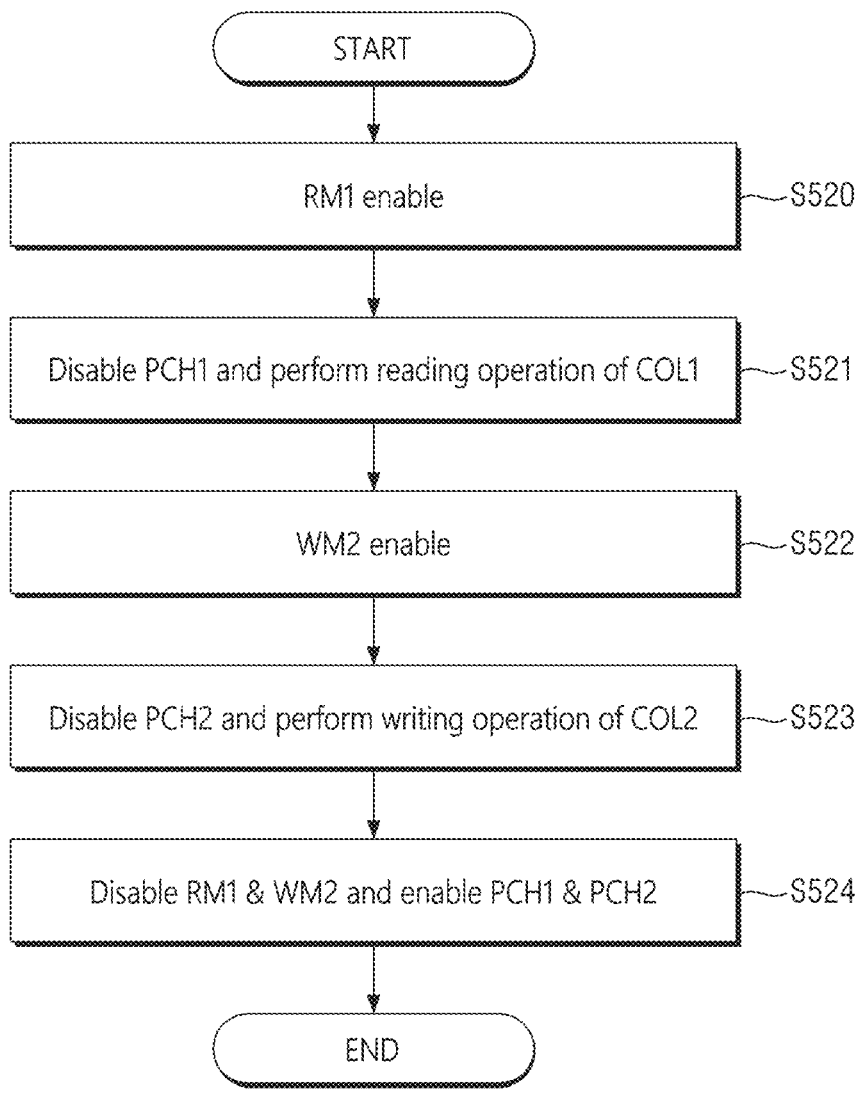
FIG. 15 is a flowchart for explaining the operation of the plurality of column lines of FIG. 12.

FIG. 15 is a flowchart for explaining the operation of the plurality of column lines of FIG. 12. FIG. 16 is a timing diagram for explaining the operation of the plurality of column lines according to FIGS. 12 and 15. For convenience of explanation, repeated parts of contents explained using FIGS. 1 to 14 will be only briefly described or omitted.

Figure 16:
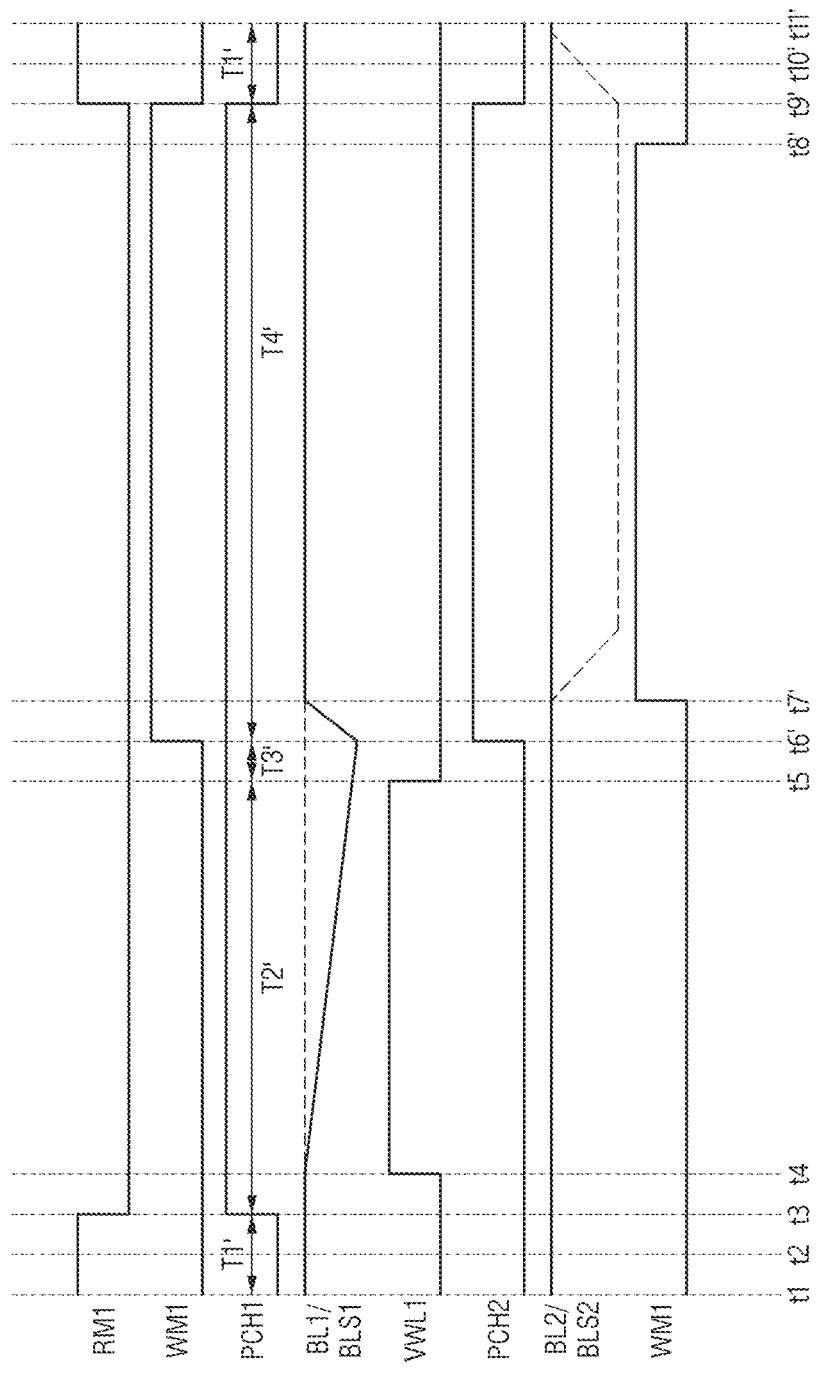
FIG. 16 is a timing diagram for explaining the operation of the plurality of column lines according to FIGS. 12 and 15.

Referring to FIGS. 12, 15 and 16, the first read multiplexer control signal RM1 may be enabled (S520). The first read multiplexer control signal RM1 applied to the first column line COL1 may have a logic low level during the time interval from the third time t3 to the ninth time t9'. The first precharge control signal generation circuit 260*a* may generate the first precharge control signal PCH1 on the basis of the first read multiplexer control signal RM1. The first precharge control signal PCH1 may have a logic high level during the time interval from the third time t3 to the ninth time t9'.

The first bit line precharge circuit 240*a* may disable the precharge, and the sense amp 237 may perform the read operation (S521). The first bit line precharge circuit 240*a* may disable the precharge of the first bit line pairs BL1 and BLS1 in response to the first precharge control signal PCH1. Further, the sense amp 237 may perform the read operation on the memory cell 131 connected to the first bit line BL1 and the first complementary bit line BLS1 during the time interval from the fourth time t4 to the fifth time t5. While the first column line COL1 performs the read operation, the second column line COL2 may not perform the write operation or the read operation.

Here, the first bit line precharge circuit 240*a* may precharge the first bit line pairs BL1 and BLS1 during a first time interval T1'. The sense amp 237 may perform the read operation during a second time interval T2' corresponding to the third time t3 to the fifth time t5. After that, the write driver 235 may perform the write operation during a fourth time interval T4' corresponding to the sixth time t6' and the ninth time t9'. The first bit line pair BL1 and BLS1 may be precharged during the first time interval T1' corresponding to the ninth time t9' to the eleventh time t11'.

Here, during a third time interval T3' corresponding to the time interval between the second time interval T2' and the fourth time interval T3', the first bit line precharge circuit 240*a* may not precharge the first bit line pair BL1 and BLS1. That is, as the first precharge control signal PCH1 has a logic high level in the second time interval T2', the third time interval T3', and the fourth time interval T4', the first bit line precharge circuit 240*a* does not precharge the first bit line pairs BL1 and BLS1. Further, while the write operation is performed on the second column line COL2 during the fourth time interval T4', and even between the times when the write operation and the read operation are performed, the first bit line pairs BL1 and BLS1 are not precharged. Therefore, the memory device 1 is provided in which the read operation may be performed immediately after the write operation, the precharge operation between the write operation and the read operation may be omitted, and the operating speed may be improved accordingly.

Subsequently, the second write multiplexer control signal WM2 may be enabled (S522). The second write multiplexer control signal WM2 applied to the second column line COL2 may have a logic high level during the time interval from the sixth time t6' to the ninth time t9'. The second precharge control signal generation circuit 260*b* may generate the second precharge control signal PCH2 on the basis of the second write multiplexer control signal WM2. The second precharge control signal PCH2 may have a logic high level during the fourth time interval T4'.

The second bit line precharge circuit 240b may disable precharge, and the write driver 235 may perform the write operation (S523). At this time, the first bit line pairs BL1 and BLS1 may not be precharged.

Subsequently, the first read multiplexer control signal RM1 and the second write multiplexer control signal WM2 may be disabled, and the first precharge control signal PCH1 and the second precharge control signal PCH2 may be enabled (S524).

Hereinafter, a memory device 1 according to some embodiments will be described referring to FIGS. 17 to 21.

Figure 17:
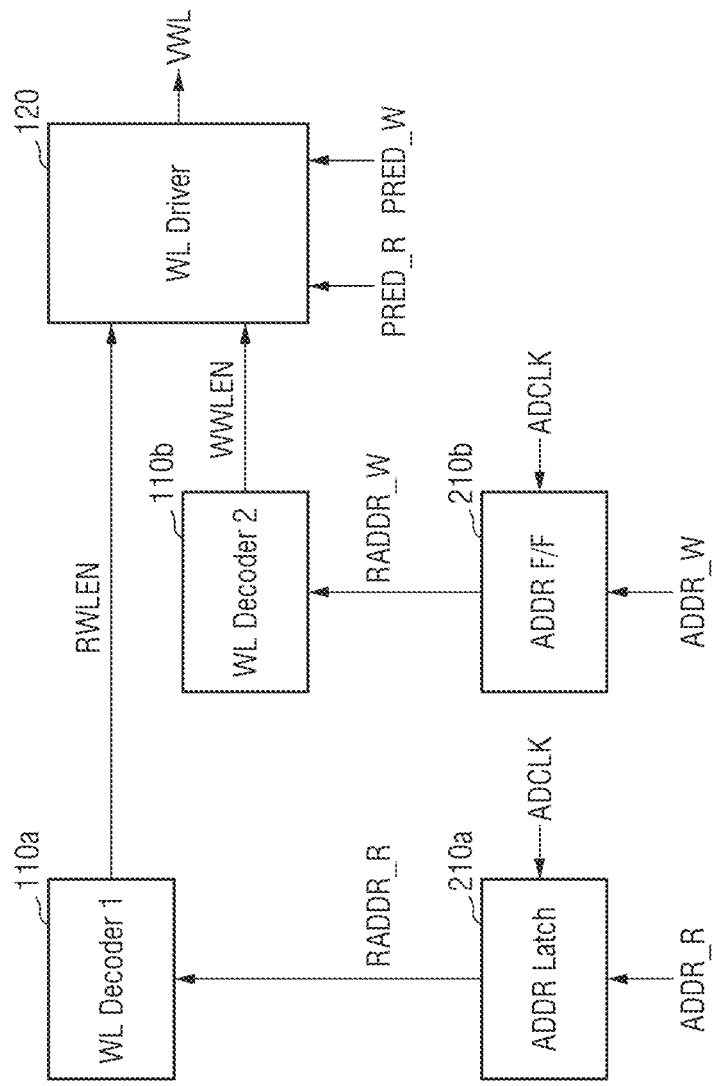
FIG. 17 is a block diagram of an address buffer, a word line decoder, and a word line driver of the memory device according to some embodiments.

FIG. 17 is a block diagram of an address buffer, a word line decoder, and a word line driver of the memory device according to some embodiments.

Referring to FIG. 17, the memory device 1 may include an address latch 210a, an address flip-flop 210b, a first word line decoder 110a, a second word line decoder 110b, and a word line driver 120. More specifically, referring to FIGS. 2 and 17, the memory circuit 100 of the memory device 1 may include a first word line decoder 110a, a second word line decoder 110b, and a word line driver 120. The address buffer 210 of the peripheral circuit 200 may include an address latch 210a and an address flip-flop 210b.

The address latch 210a and the address flip-flop 210b may be placed separately from each other. The address latch 210a may be directly connected to the first word line decoder 110a, and the address flip-flop 210b may be directly connected to the second word line decoder 110b. That is, a switch may not be placed between the address latch 210a and the first word line decoder 110a, and a switch may not be placed between the address flip-flop 210b and the second word line decoder 110b.

The address latch 210a may receive the read address signal ADDR_R from the controller 300 and may receive the address clock signal ADCLK from the clock signal generator 220. Further, the address latch 210a may output the read row address signal RADDR_R by buffering the read address signal ADDR_R on the basis of the address clock signal ADCLK. The address flip-flop 210b may receive the write address signal ADDR_W from the controller 300, and may receive the address clock signal ADCLK from the clock signal generator 220. Further, the address flip-flop 210b may output the write row address signal RADDR_W by buffering the write address signal ADDR_W on the basis of the address clock signal ADCLK. Here, the read row address signal RADDR_R and the write row address signal RADDR_W may be output at different times from each other. Here, the read row address signal RADDR_R may include low and high read row address signals, and the write row address signal RADDR_W may include low and high write row address signals.

The first word line decoder 110a may decode the read row address signal RADDR_R to output the read word line enable signal RWLEN, and the second word line decoder 110b may decode the write row address signal RADDR_W to output the write word line enable signal WWLEN. The first word line decoder 110a may select the word line that reads the data among the plurality of word lines, by providing the read word line enable signal RWLEN to the word line driver 120. The second word line decoder 110b may select a word line that writes data among the plurality of word lines, by providing the write word line enable signal WWLEN to the word line driver 120. Further, the word line driver 120 may apply the word line signal VWL to the word line selected on the basis of the read row address signal RADDR_R and/or the write row address signal RADDR_W.

Figure 18:
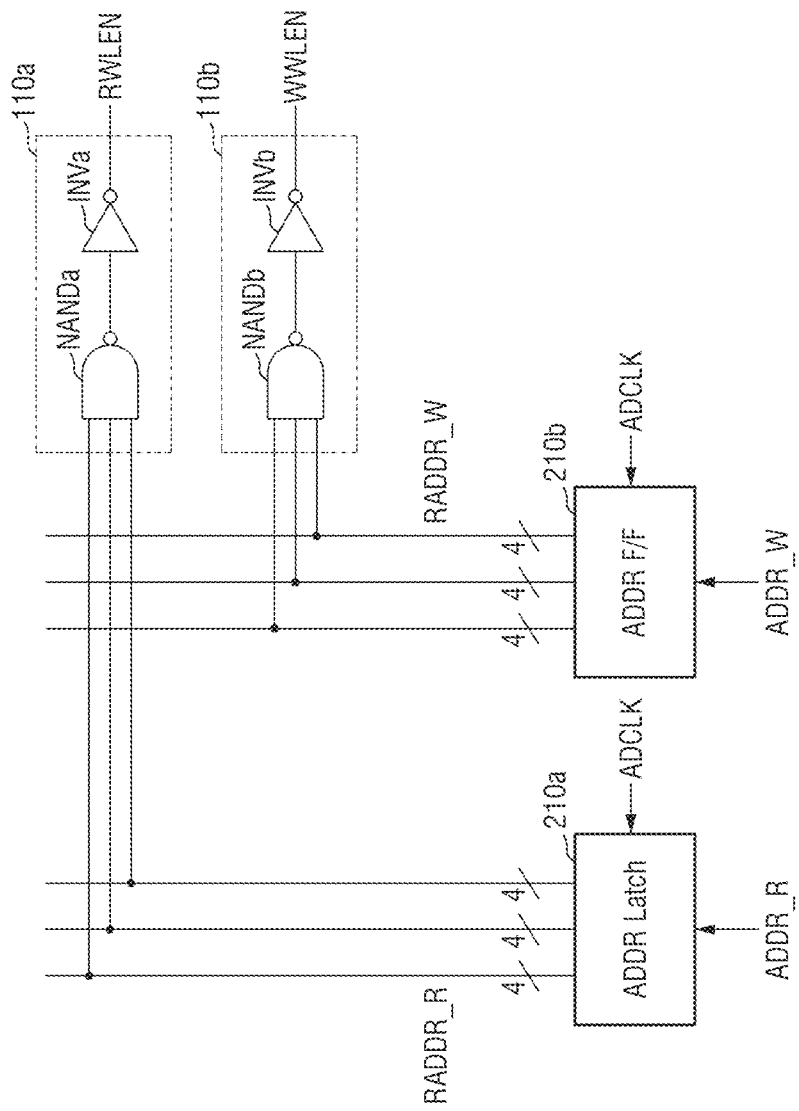
FIG. 18 is a diagram for explaining the plurality of address buffers and the plurality of word line decoders of FIG. 17.
Figure 19:
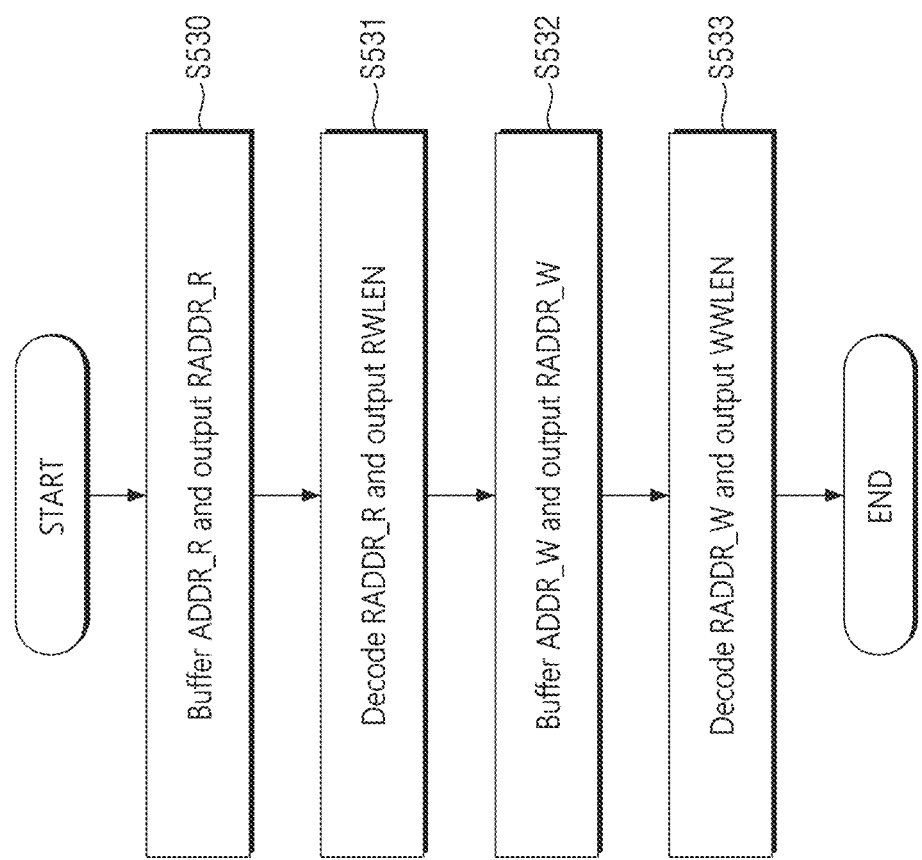
FIG. 19 is a flowchart for explaining the operation of the plurality of address buffers and the plurality of word line decoders of FIG. 18.
Figure 20:
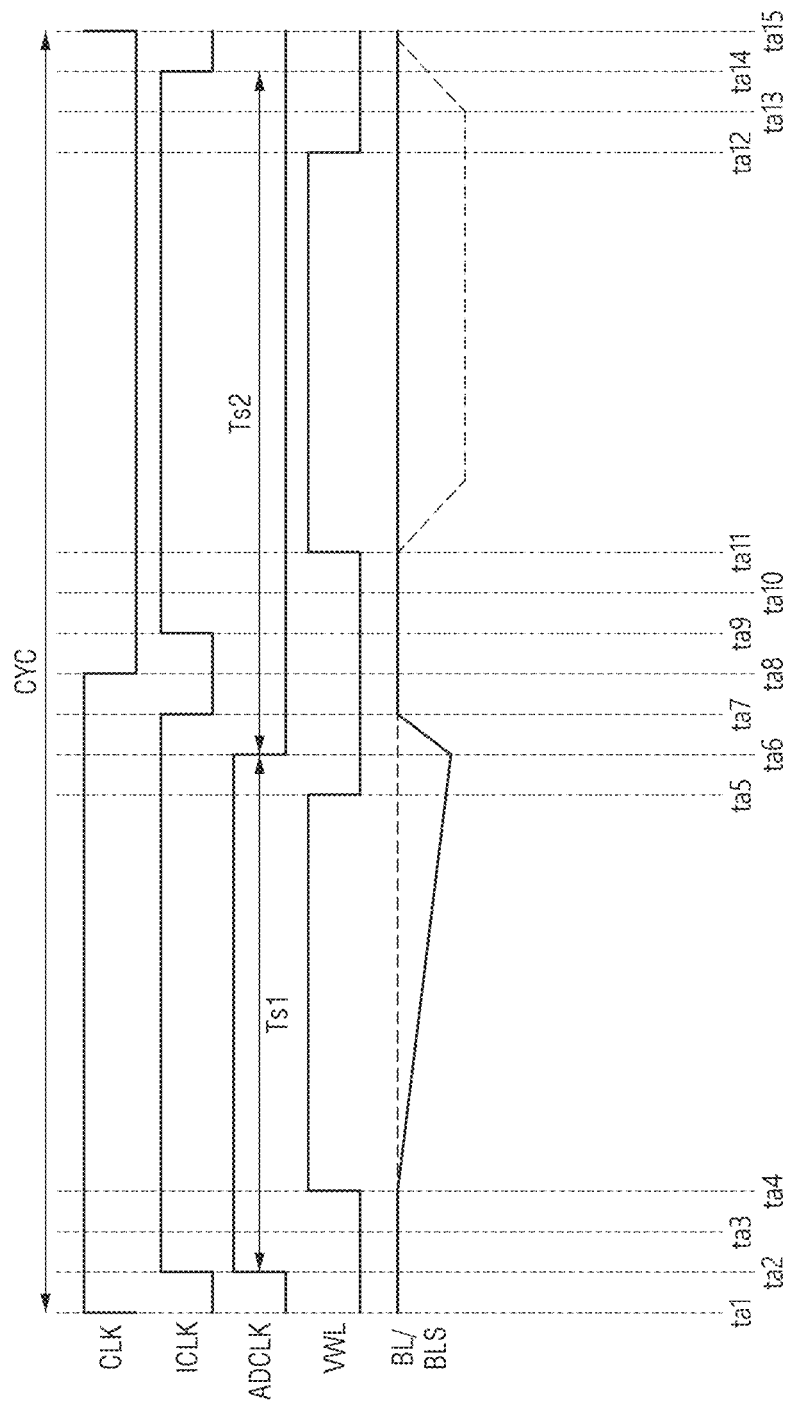
FIG. 20 is a timing diagram for explaining the operation of the plurality of address buffers and the plurality of word line decoders of FIG. 18.

FIG. 18 is a diagram for explaining the plurality of address buffers and the plurality of word line decoders of FIG. 17. FIG. 19 is a flowchart for explaining the operation of the plurality of address buffers and the plurality of word line decoders of FIG. 18. FIG. 20 is a timing diagram for explaining the operation of the plurality of address buffers and the plurality of word line decoders of FIG. 18.

Referring to FIGS. 18 to 20, the address latch 210a may buffer the read address signal ADDR_R and may output the read row address signal RADDR_R (S530). The address latch 210a may buffer the read address signal ADDR_R, using the address clock signal ADCLK. At this time, the address clock signal ADCLK may correspond to the signal generated by being triggered from the system clock signal CLK. The address clock signal ADCLK may have a logic high level during a first time interval Ts1 corresponding to a second time ta2 to a ninth time ta9, and may have a logic low level during a second time interval Ts2 corresponding to the ninth time ta9 to a fourteenth time ta14. That is, the address clock signal ADCLK may have a logic high level at the time when the read address signal ADDR_R is buffered, and the address clock signal ADCLK may have a logic low level at the time when the write address signal ADDR_W is buffered. However, the embodiments of the present inventive concepts are not limited thereto.

The address latch 210a may output the read row address signal RADDR_R to three output groups having four output terminals. The address latch 210a may generate a read row address signal RADDR_R on the basis of the address clock signal ADCLK during the time interval corresponding to the second time ta2 to the fourth time ta4. The read row address signal RADDR_R may be transmitted directly to the first word line decoder 110a.

Subsequently, the first word line decoder 110a may decode the read row address signal RADDR_R to output the read word line enable signal RWLEN (S531). The first word line decoder 110a may directly receive the read row address signal RADDR_R from the address latch 210a to perform decoding. Here, the read row address signal RADDR_R may correspond to a high read row address signal. The first word line decoder 110a may decode the read row address signal RADDR_R during the time interval corresponding to the second time ta2 to the fourth time ta4.

The first word line decoder 110a may include a NAND logic element NANDa and an inverter INVa connected in series. The NAND logic element NANDa and the inverter INVa may output the read word line enable signal RWLEN by performing an operation on the read row address signal RADDR_R. Here, the read word line enable signal RWLEN may correspond to an enable signal of the word line address of the memory cell array 130 which performs the read.

Subsequently, the address flip-flop 210b may buffer the write address signal ADDR_W and may output the write row address signal RADDR_W (S532). The address flip-flop 210b may buffer the write address signal ADDR_W, using the address clock signal ADCLK. At this time, the address clock signal ADCLK may have a logic low level at the time when the write address signal ADDR_W is buffered. The address flip-flop 210b may buffer the write address signal ADDR_W on the basis of the falling edge of the address clock signal ADCLK. Therefore, the address clock signal ADCLK does not need to maintain a logic high level during the clock cycle CYC. Stated differently, the logic high level of the address clock signal ADCLK does not need to be maintained until the write operation ends. Therefore, the clock cycle CYC may also be reduced. In other words, the memory device 1 having improved operating speed is provided through the address flip-flop 210*b* that buffers the write address signal ADDR_W.

The address flip-flop 210*b* may output the write row address signal RADDR_W to three output groups having four output terminals. The address flip-flop 210*b* may generate a write row address signal RADDR_W on the basis of the address clock signal ADCLK during the time interval corresponding to the ninth time ta9 to the eleventh time tall. The write row address signal RADDR_W may be transmitted directly to the second word line decoder 110*b*.

Subsequently, the second word line decoder 110*b* may decode the write row address signal RADDR_W and may output the write word line enable signal WWLEN (S533). The second word line decoder 110*b* may directly receive the write row address signal RADDR_W from the address flip-flop 210*b* to perform decoding. Here, the write row address signal RADDR_W may correspond to the high write row address signal. The second word line decoder 110*b* may decode the write row address signal RADDR_W during the time interval corresponding to the ninth time ta9 to the eleventh time tall.

The second word line decoder 110*b* may include a NAND logic element NANDb and an inverter INVb connected in series. The NAND logic element NANDb and the inverter INVb may output the write word line enable signal WWLEN by performing an operation on the write row address signal RADDR_W. Here, the write word line enable signal WWLEN may correspond to an enable signal of the address of the word line of the memory cell array 130 that performs the write.

As described, the read address signal ADDR_R may be transmitted to the first word line decoder 110*a* through the address latch 210*a*, and the first word line decoder 110*a* may output the read word line enable signal RWLEN through the decoding. Further, the write address signal ADDR_W may be transmitted to the second word line decoder 110*b* through the address flip-flop 210*b*, and the second word line decoder 110*b* may output the write word line enable signal WWLEN through the decoding. That is, because the read word line enable signal RWLEN and the write word line enable signal WWLEN are output through different buffers and the word line decoders, the operating speed of the word line decoder 110 may be further improved. That is, the time interval corresponding to the second time ta2 to the fourth time ta4, and the time interval corresponding to the ninth time ta9 to the eleventh time tall may be further reduced. This may make it possible to provide the memory device 1 having enhanced signal integrity and improved operating speed.

Figure 21:
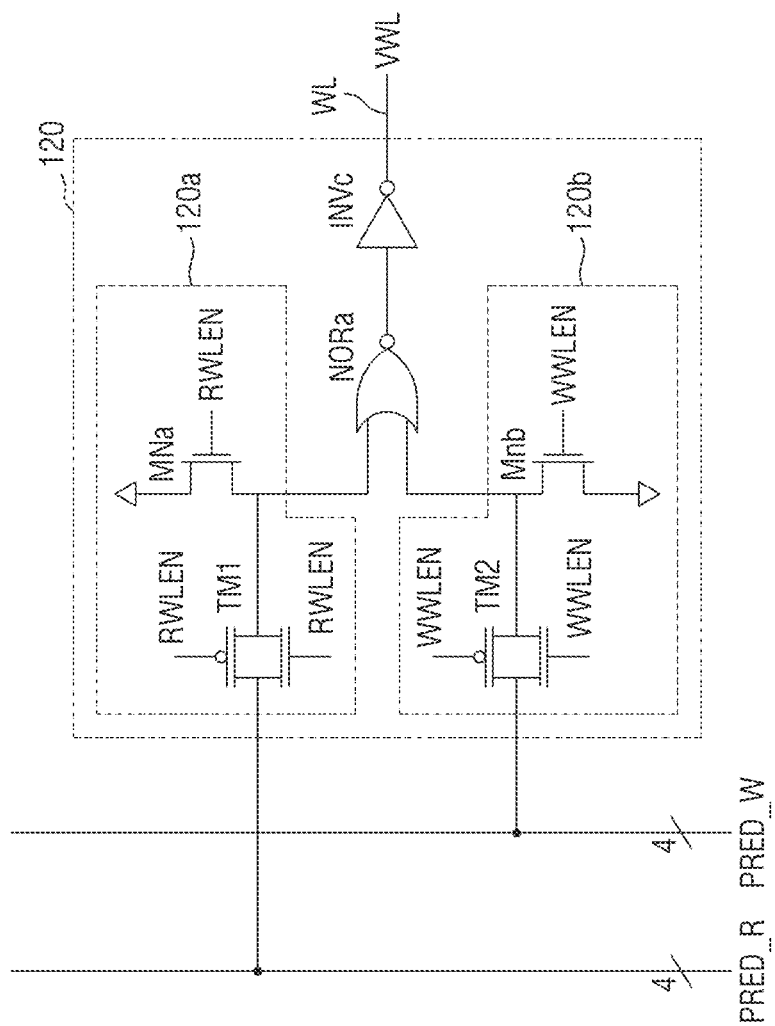
FIG. 21 is a diagram for explaining the plurality of word line drivers of FIG. 18.

FIG. 21 is a diagram for explaining the plurality of word line drivers of FIG. 18.

Referring to FIG. 21, the word line driver 120 may include a first word line driver 120*a*, a second word line driver 120*b*, a NOR logic element NORa, and an inverter INVc. Here, the first word line driver 120*a* and the second word line driver 120*b* may each be placed apart from each other.

The first word line driver 120*a* may include a first transmission gate TM1 and an NMOS transistor MNa. The first transmission gate TM1 may receive a read predeck signal PRED_R from the word line predecoder 250, and may receive a read word line enable signal RWLEN from the first word line decoder 110*a*. The first transmission gate TM1 may select one of a plurality of word lines and apply the word line signal VWL on the basis of the read word line enable signal RWLEN and the read predeck signal PRED_R. At this time, the signal that is output from the first transmission gate TM1 may be output to the word line WL through the NOR logic element NORa and the inverter INVc. That is, the inverter INVc may apply the word line signal VWL to the selected word line WL.

The second word line driver 120*b* may include a second transmission gate TM2 and an NMOS transistor MNb. The second transmission gate TM2 may receive the write predeck signal PRED_W from the word line predecoder 250, and receive the write word line enable signal WWLEN from the second word line decoder 110*b*. The second transmission gate TM2 may select one of a plurality of word lines and apply the word line signal VWL on the basis of the write word line enable signal WWLEN and the write predeck signal PRED_W. At this time, the signal that is output from the second transmission gate TM2 may be output to the word line WL through the NOR logic element NORa and the inverter INVc. That is, the inverter INVc may apply the word line signal VWL to the selected word line WL.

Here, the first word line driver 120*a* and the second word line driver 120*b* may be commonly connected to the NOR logic element NORa and the inverter INVc.

The first word line driver 120*a* may operate during the first time interval Ts1, and the second word line driver 120*b* may operate during the second time interval Ts2. More specifically, the first word line driver 120*a* may operate in the time interval corresponding to the second time ta2 to the fourth time ta4, and the second word line driver 120*b* may operate in the time interval corresponding to the ninth time ta9 to the eleventh time tall.

The word line signal VWL may be output from the first word line driver 120*a* when the read operation of the memory device 1 is performed, and the word line signal VWL may be output from the second word line driver 120*b* when the write operation of the memory device 1 is performed. That is, since the word line signal VWL is output through different word line drivers, the operating speed of the word line driver 120 may be further improved. That is, the time interval corresponding to the second time ta2 to the fourth time ta4 and the time interval corresponding to the ninth time ta9 to the eleventh time tall may be further reduced. This may make it possible to provide the memory device 1 having improved signal integrity and improved operating speed.

Figure 22:
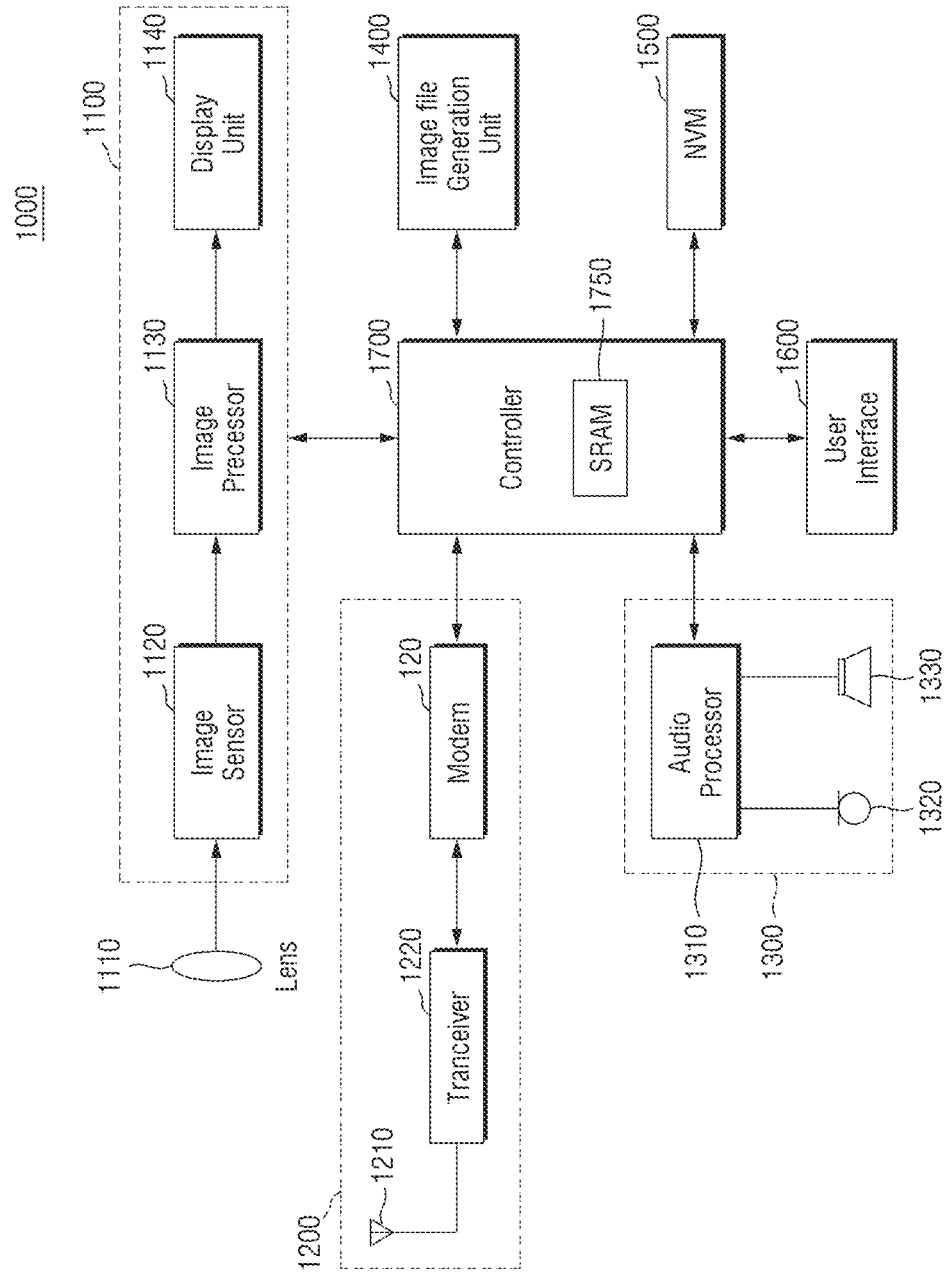
FIG. 22 is a diagram of a mobile terminal, which may include a memory device according to some embodiments.

FIG. 22 is a diagram of a mobile terminal, which may include a memory device according to some embodiments.

Referring to FIG. 22, a mobile terminal 1000 according to some embodiments may include an image processing unit 1100, a wireless transmission and reception unit 1200, an audio processing unit 1300, an image file generation unit 1400, a non-volatile memory device 1500, a user interface 1600, and a controller 1700.

The image processing unit 1100 may include a lens 1110, an image sensor 1120, an image processor 1130, and a display unit 1140. The wireless transmission and reception unit 1200 may include an antenna 1210, a transceiver 1220, and a modem 1230. The audio processing unit 1300 may include an audio processor 1310, a microphone 1320, and a speaker 1330.

The mobile terminal 1000 may include various types of semiconductor devices. In particular, in the case of an application processor that executes the functions of the controller 1700, low power and high performance may be required. In response to such requirement, the controller 1700 may be a multi-core processor depending on the miniaturization process. The controller 1700 may include a SRAM 1750 including the word line predecoder of the present inventive concepts. The SRAM 1750 may include the memory device 1 described referring to FIGS. 1 to 21. Therefore, the SRAM 1750 may have improved operating speed and improved signal integrity.

The system-on-chip according to the invention may be formed using various forms of packages. For example, the system-on-chip according to the present invention may be formed, using packages such as PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flatpack), SOIC (Small Outline Integrated Circuit), SSOP (Shrink Small Outline Package), TSOP (Thin Small Outline), TQFP (Thin Quad Flatpack), SIP (System In Package), MCP (Multi Chip Package), WFP (Wafer-level Fabricated Package), and WSP (Wafer-Level Processed Stack Package).

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A pseudo dual port memory device comprising:
   a memory cell;
   a pair of bit lines connected to the memory cell;
   a write driver;
   a sense amp;
   a column multiplexer which is connected to the bit lines and configured to receive a write multiplexer control signal and a read multiplexer control signal, the column multiplexer configured to connect the bit lines to the write driver in response to the write multiplexer control signal and configured to connect the bit lines to the sense amp in response to the read multiplexer control signal;
   a precharge control signal generation circuit which is connected to the column multiplexer and configured to generate a precharge control signal on the basis of the write multiplexer control signal and the read multiplexer control signal; and
   a bit line precharge circuit which is connected to the precharge control signal generation circuit and the pair of bit lines and configured to precharge the bit lines on the basis of the precharge control signal.

2. The pseudo dual port memory device of claim 1, wherein the precharge control signal generation circuit is configured to receive the write multiplexer control signal and the read multiplexer control signal, and
   wherein the precharge control signal generation circuit is configured to generate a logic high precharge control signal when the read multiplexer control signal is enabled and the write multiplexer control signal is disabled.

3. The pseudo dual port memory device of claim 2, wherein the bit line precharge circuit is configured to disable precharging on the bit lines on the basis of the logic high precharge control signal.

4. The pseudo dual port memory device of claim 1, wherein the precharge control signal generation circuit is configured to receive the write multiplexer control signal and the read multiplexer control signal, and the precharge control signal generation circuit is configured to generate a logic low precharge control signal when the read multiplexer control signal is disabled and the write multiplexer control signal is disabled.

5. The pseudo dual port memory device of claim 1, wherein the sense amp and the write driver are configured to perform read and write operations on the memory cell during a clock cycle,
   the clock cycle includes a first time interval, a second time interval, a third time interval, and a fourth time interval which are arranged sequentially,
   wherein the bit line precharge circuit is configured to precharge the bit lines during the first time interval, and configured not to precharge the bit lines during the second and fourth time intervals,
   wherein the sense amp is configured to perform the read operation during the second time interval, and
   wherein the write driver is configured to perform the write operation during the fourth time interval.

6. The pseudo dual port memory device of claim 5, wherein the bit line precharge circuit is configured to not precharge the bit lines during the third time interval.

7. The pseudo dual port memory device of claim 1, wherein the precharge control signal generation circuit includes an inverter that is configured to invert the write multiplexer control signal, and a NAND logic element that is configured to calculate the inverted write multiplexer control signal and the read multiplexer control signal and output a precharge control signal.

8. A pseudo dual port memory device comprising:
   a first column line;
   a second column line which is different from the first column line;
   a write driver connected to both of the first and second column lines; and
   a sense amp connected to both of the first and second column lines,
   wherein the first column line includes:
      a first memory cell;
      a pair of first bit lines connected to the first memory cell;
      a first column multiplexer connected to the first bit lines and configured to connect the first bit lines to the write driver in response to a first write multiplexer control signal and connect the first bit lines to the sense amp in response to a first read multiplexer control signal; and
      a first bit line precharge circuit configured to precharge the first bit lines in response to the first write multiplexer control signal and the first read multiplexer control signal, and
   wherein the second column line includes:
      a second memory cell;
      a pair of second bit lines connected to the second memory cell;
      a second column multiplexer connected to the second bit lines and configured to connect the second bit lines to the write driver in response to a second write multiplexer control signal and connect the second bit lines to the sense amp in response to a second read multiplexer control signal; and
      a second bit line precharge circuit configured to precharge the second bit lines in response to the second write multiplexer control signal and the second read multiplexer control signal.

9. The pseudo dual port memory device of claim 8, wherein the first column line includes a first precharge control signal generation circuit that directly connects the first column multiplexer and the first bit line precharge circuit, and the second column line includes a second precharge control signal generation circuit that directly connects the second column multiplexer and the second bit line precharge circuit.

10. The pseudo dual port memory device of claim 8, wherein the second bit line precharge circuit is configured to enable precharging on the second bit lines during a first time interval, and configured to disable precharging on the second bit lines during a second time interval that is subsequent to the first time interval, and the first bit line precharge circuit is configured to disable precharging on the first bit lines during the first and second time intervals.

11. The pseudo dual port memory device of claim 9, wherein the first precharge control signal generation circuit includes an inverter that is configured to invert the first write multiplexer control signal, and a NAND logic element that is configured to calculate the inverted write multiplexer control signal and the first read multiplexer control signal and output a precharge control signal.

12. The pseudo dual port memory device of claim 8, wherein the first bit line precharge circuit is configured to disable precharging on the first bit lines when one of the first write multiplexer control signal and the first read multiplexer control signal is enabled, and configured to enable precharging on the first bit lines when both the first write multiplexer control signal and the first read multiplexer control signal are disabled.

13. A pseudo dual port memory device comprising:
a memory cell;
a pair of bit lines connected to the memory cell;
a column multiplexer connected to the bit lines and configured to receive a write multiplexer control signal and a read multiplexer control signal;
a bit line precharge circuit configured to precharge the bit lines during a first time interval in response to the write multiplexer control signal and the read multiplexer control signal;

a sense amp configured to perform a read operation during a second time interval that is subsequent to the first time interval; and
a write driver configured to perform a write operation during a third time interval that is subsequent to the second time interval,
wherein the column multiplexer is configured to connect the bit lines to the write driver in response to the write multiplexer control signal and connect the bit lines to the sense amp in response to the read multiplexer control signal, and
wherein the bit line precharge circuit is configured to not perform a precharge operation on the bit lines during a fourth time interval between the second time interval and the third time interval.

14. The pseudo dual port memory device of claim 13, wherein the bit line precharge circuit is configured to not perform precharge on the bit lines during the second time interval and the third time interval.

15. The pseudo dual port memory device of claim 13, wherein the sense amp is configured to perform the read operation at a rising edge of a clock signal, and the write driver is configured to perform the write operation at a falling edge of the clock signal.

16. The pseudo dual port memory device of claim 1, wherein the precharge control signal generation circuit is configured to generate a logic high precharge control signal when the read multiplexer control signal is disabled and the write multiplexer control signal is enabled, and
wherein the bit line precharge circuit is configured to disable precharging on the bit lines on the basis of the logic high precharge control signal.

17. The pseudo dual port memory device of claim 4, wherein the bit line precharge circuit is configured to enable precharging on the bit lines on the basis of the logic low precharge control signal.

18. The pseudo dual port memory device of claim 7, wherein the bit line precharge circuit includes a PMOS transistor having a gate configured to receive the precharge control signal and a source/drain connected to the bit lines.

\* \* \* \* \*